US008621313B2

(12) United States Patent
Le Floch et al.

(10) Patent No.: US 8,621,313 B2
(45) Date of Patent: Dec. 31, 2013

(54) METHOD AND A DEVICE FOR ADAPTING ERROR PROTECTION IN A COMMUNICATION NETWORK, AND A METHOD AND DEVICE FOR DETECTING BETWEEN TWO STATES OF A COMMUNICATION NETWORK CORRESPONDING TO DIFFERENT LOSSES OF DATA

(75) Inventors: Hervé Le Floch, Rennes (FR); Frédéric Maze, Langan (FR); Eric Nassor, Thorigne Fouillard (FR)

(73) Assignee: Canon Kabushiki Kaisha, Tokyo (JP)

( * ) Notice: Subject to any disclaimer, the term of this patent is extended or adjusted under 35 U.S.C. 154(b) by 159 days.

(21) Appl. No.: 13/079,702

(22) Filed: Apr. 4, 2011

(65) Prior Publication Data
US 2011/0271163 A1  Nov. 3, 2011

(30) Foreign Application Priority Data

Apr. 6, 2010 (FR) ...................................... 10 52596
Apr. 6, 2010 (FR) ...................................... 10 52597

(51) Int. Cl.
*H03M 13/00* (2006.01)

(52) U.S. Cl.
USPC .......................................... 714/752; 714/758

(58) Field of Classification Search
USPC .................................................. 714/752, 758
See application file for complete search history.

(56) References Cited

U.S. PATENT DOCUMENTS 5,699,369 A * 12/1997 Guha ............................ 714/774
2010/0020713 A1 * 1/2010 Frankkila ..................... 370/252

OTHER PUBLICATIONS

R.Chen, et al., Adaptive error coding using channel prediction, Wireless Networks vol. 5, No. 1, Jan. 1, 1999, pp. 23-31.
Quingwen Liu et al., "TCP Performance in Wireless Access With Adaptive Modulation and Coding", IEEE, vol. 7, Jun. 20, 2004, pp. 3989-3993.
Kim K H et al., "Energy-Aware Error Correction for QOS-Provisioning Real-Time Communications in Wireless Networks", IEICE Trans. Fundamentals, vol. E91-A, No. 7, Jul. 1, 2008, pp. 1682-1685.
Vincent Lau, et al., "On the Encoding Rate and Discete Modulation Adapation Design for MIMO Links", IEEE Transactions on Wireless Communications, vol. 6, No. 1, Jan. 1, 2007, pp. 50-54.

* cited by examiner

*Primary Examiner* — Sam Rizk
(74) *Attorney, Agent, or Firm* — Canon USA Inc IP Division

(57) ABSTRACT

A method for adapting error protection in a communication network includes: a step of determining periods of time that are homogeneous as regards the distribution law of losses over the network, a step of classifying the homogeneous periods of time into at least two classes, on the basis of information representing losses over the network and/or representing a corresponding level of protection, during these periods of time, a step of determining a probability of alternation between two of said classes, and a step of selecting a protection strategy on the basis of said probability of alternation. A method of detecting transition between two states of a communication network corresponding to different loss rates of sent data includes: a step of determining a probability of transition, and a step of determining the existence of a transition on the basis of said probability.

25 Claims, 17 Drawing Sheets

METHOD AND A DEVICE FOR ADAPTING ERROR PROTECTION IN A COMMUNICATION NETWORK, AND A METHOD AND DEVICE FOR DETECTING BETWEEN TWO STATES OF A COMMUNICATION NETWORK CORRESPONDING TO DIFFERENT LOSSES OF DATA

CROSS REFERENCE TO RELATED APPLICATIONS

This application claims priority to French Patent Application No. 1052596 filed Apr. 6, 2010, and French Patent Application No. 1052597 filed Apr. 6, 2010, each of which are hereby incorporated by reference in their entireties.

BACKGROUND OF THE INVENTION

The present invention concerns a method and a device for adapting error protection in a communication network. It applies, in particular, to the transmission of data from a data server to at least one client via a packet transmission network subject to packet loss. For example, the network is a network implementing the IP Internet protocol for transporting IP packets. The network may be wired or wireless. Adapting error protection may comprise adapting error correction codes.

The present invention further concerns a method and device for detecting transition in the distribution law for losses of packets transmitted over a communication network and a method and device for protecting the transmitted data. It applies, in particular, to an adaptation of a level of redundancy, especially a level of error correcting codes, in a transmission of packets over a network subject to packet losses, whether or not it be a wired network.

The types of loss considered include:
 losses due to congestion of the network: in this case, the quantity of data sent is too high and at least one router of the network loses a proportion of the packets it receives, and
 losses due to interference, for example which may arise on a wireless link of the network due to extraneous microwaves.

To take into account these losses, two types of protection are provided at the server. The first implements a congestion control algorithm. If loss notifications are received by the server, it may thus reduce the sending rate. Algorithms such as TCP (acronym for "Transmission Control Protocol") and TFRC (acronym for "TCP Friendly Rate Control") implement this strategy.

The second type of protection implements error correcting or "FEC" codes, ("FEC" for "Forward Error Correction"). An error correcting code enables redundancy packets to be generated from data packets to be able to restore erroneous received packets or lost packets. The FEC redundancy packets are coupled to the payload data to protect them by permitting their restoration in case of loss. The restoration succeeds if the rate of losses or errors remains below a certain limit, dependent on the level of redundancy generated.

Generally, the proportion of redundancy packets is increased when packet losses are detected.

Consequently, it is desirable to determine an appropriate level of redundancy. Too low a level corresponds to insufficient protection of the data. On the other hand, too high a level results in unnecessary congestion of the network by the redundancy packets.

Only packet losses are considered below, since erroneous packets received are eliminated and are thus also considered as being lost packets.

During a data transmission, the loss rate may strongly vary from one moment to the next. Moreover, to find the suitable level of redundancy and adapt it rapidly, it is necessary to rapidly detect strong variations in the loss rate.

It is important to determine the adequate proportion of redundancies, in particular during a period of congestion. This is because, as the available rate decreases in case of congestion, for example due to the implementation of one of the protocols TFRC or TCP, the quantity of data sent is reduced. If the information to transmit is video, this video must then be highly compressed to be sent in real time. Furthermore, if the proportion of redundancy packets is also increased, the compression rate of the video may become very high, which implies visible compression effects, such as block effects which may be unpleasant.

Consequently, to find the adequate proportion of redundancy packets during a period of congestion is important, in psycho-visual terms, when video data are transmitted.

The detection of a period of congestion is not instantaneous. Usually, the client detects the occurrence of packet loss and sends a loss notification back to the server. This implies a delay in the adaptation of the transmission rate and in the increase of the proportion of redundancies. This lag is due:
 to the delay in detecting the lost packets that are identified as congestion losses, at the client,
 to the delay in generating and transmitting the notification back from the client to the server, and
 to the buffer of RTP packets that are already ready to be sent, which may not be sufficiently protected.

On account of this lag, the proportion of lost packets may be very high at the start of a congestion phase. If these packets concern a real-time video stream, the visual effect may be disastrous.

Consequently, a known strategy consists of continuously providing a high proportion of redundancies to anticipate the occurrence of a congestion phase. However, during the congestion phases, this strategy imposes occupancy of the bandwidth by the redundancies which, by imposing a high compression rate, results in a lower image quality.

Consequently, a strategy which consists of adapting the proportion of redundancy packets during a congestion phase is preferable.

Document US 2006/0251011 describes a loss tolerant TCP algorithm, which means that redundancy packets are added to the payload data packets in windows of dimension W of the TCP protocol. To compute the ratio between the redundancy packets and the payload data packets in the current window, a loss rate is computed over the preceding window of dimension W. However, if the size of the windows is small, the ratio computed is unstable, like the rate of loss and, if the size of the windows is large, taking a congestion into account is delayed. The extrapolation over the preceding window does not reflect the real variations in the loss rate and the adaptation of the redundancy level to the loss rate is thus not fast enough.

Document PCT/US01/45222 proposes to adapt the protection by redundancies on the basis of the length of the periods of bursts of losses. However, burst periods are determined in the analog domain. This method cannot therefore be applicable in the case of IP/RTP packets.

Document U.S. Pat. No. 7,328,394 describes a module which adapts the FEC redundancy rate on the basis of a record which is composed of successive windows of fixed size. An FEC redundancy rate is tested and makes it possible to compute a rate of loss for each of the consecutive windows by simulating a correction by use of FEC redundancies. The final loss rate is determined by weighting the loss rates for each window, using a weighting which is inversely proportional to the age (period elapsed) of the window. The rate of redundancies which leads to the final target loss rate is selected. However, this module has the same drawbacks as the method described in document US 2006/0251011.

SUMMARY OF THE INVENTION

The present invention aims to mitigate these drawbacks.

To that end, according to a first aspect, the present invention is directed to a method for adapting error protection in a communication network, characterized in that it includes:
- a step of determining periods of time that are homogeneous as regards the distribution law of losses over the network,
- a step of classifying the homogeneous periods of time into at least two classes, on the basis of information representing losses over the network and/or representing a corresponding level of protection, during these periods of time, and
- a step of selecting a protection strategy on the basis of said classes.

The implementation of this aspect of the present invention makes it possible, in particular, to detect when the network conditions are suitable to apply one strategy or another. In particular, it makes it possible to detect, on the basis of an analysis of the past, whether an adaptation of the protection, that is a local adaptation in temporal terms, may be used during periods of congestion to come. A protection strategy for future homogeneous periods may be selected.

The advantage of automatically detecting whether a local adaptation is possible is that this makes it possible to compute the best proportion of FEC redundancy packets while ensuring good protection for the packets of payload data. As the proportion of FEC redundancies is optimal, because the quantity of FEC redundancy packets is minimized and because, therefore, the quantity of video payload data packets may be increased, the compression rate of the video is lower and the visual quality rendered is improved.

In a particular embodiment the method may include a step of determining a probability of alternation between two of said classes, and the protection strategy may be selected on the basis of said probability of alternation.

According to particular features, during the step of selecting a protection strategy,
- a first strategy that may be selected includes implementing a fixed level of protection for the future homogeneous periods of time for each class, and
- a second strategy that may be selected includes implementing a fixed level of protection for the future homogeneous periods of time for one of the classes and a variable level of protection for the future homogeneous periods of time for another class.

According to particular features, in the case of the second strategy,
- the class of homogeneous periods of time for which a fixed level of protection has been implemented corresponds to the periods of time that have suffered the least losses, and the other class of homogeneous periods of time for which a variable level of protection has been implemented corresponds to the periods of time that have suffered the most losses.

According to particular features the first strategy is selected when the probability of alternation is less than a predetermined value and the second strategy is selected when the probability of alternation is greater than a predetermined value.

According to particular features, during the strategy selecting step, in the first or the second strategy, the fixed level of protection corresponds to the protection necessary for the period of time suffering the highest rate of loss.

According to particular features, during the classifying step, a first class corresponds to the periods of time with a low level of FEC protection and/or a low loss rate and a second class corresponds to the periods of time with a high level of protection by FEC and/or a high loss rate.

According to particular features, during the classifying step, a "Lloyd-max" algorithm is implemented.

According to particular features, during the step of determining a probability of alternation, this probability is equal to the number of alternations between the two classes on passing through the successive periods of time, divided by the number of periods considered less one.

According to a second aspect, the present invention is directed to a device for adapting error correcting codes in a communication network, characterized in that it includes:
- a means for determining periods of time that are homogeneous as regards the distribution law of losses over the network,
- a means for classifying the homogeneous periods of time into at least two classes, on the basis of information representing losses over the network and/or representing a corresponding level of protection, during these periods of time,
- a means for determining a probability of alternation between two of said classes, and
- a means for selecting a protection strategy on the basis of said probability of alternation.

According to a third aspect, the present invention concerns a computer program loadable into a computer system, said program containing instructions enabling the implementation of the method of the first aspect of the present invention, as succinctly set forth above.

According to a fourth aspect, the present invention concerns an information carrier such as a storage medium readable by a computer or a microprocessor, removable or not, storing instructions of a computer program, characterized in that it enables the implementation of the method of the present invention, as succinctly set forth above.

According to a fifth aspect, the present invention concerns a method of detecting transition between two states of a communication network corresponding to different loss rates of sent data, characterized in that it includes:
- a step of determining a probability of transition and
- a step of determining the existence of a transition on the basis of said probability.

This aspect of the present invention thus provides a solution for rapidly detecting the variations or transitions in loss distribution and, consequently, for determining periods of time that are homogeneous in terms of loss distribution law. This detection has various applications, for example:
- to evaluate the transmission conditions over a network, and
- to adapt a level of redundancy on the basis of the distribution law determined for a homogenous period of time.

According to particular features, during the step of determining a probability, the probability of transition is determined on the basis of the data losses occurring after the last detected transition.

The transitions are thus detected iteratively. To be precise, each detected transition enables the following transition to be detected since the determination of transition probability is made on the basis of the losses occurring since the previous transition.

According to particular features, the communication network conveying data packets, the step of determining a probability of transition includes:
- a step of detecting lost packets from among the data packets sent;
- a step of determining distances representing separations between the sequence numbers of said lost packets, and
- a step of calculating probability of transition between a first set of distances and a second set of distances chosen from among the determined distances.

The probability determination is thus simplified by the fact of using distances representing separations between sequence numbers, which are easy to determine.

According to particular features, the communication network conveying data packets, during the step of determining a transition probability, determination is made, for a plurality of candidate packets sent since the last detected transition, a probability of a transition taking place at the time of the transmission of one of those candidate packets.

The events prior to and subsequent to the transmission of that candidate packet are thus separated, which avoids having to consider it in one and then in the other of the distributions.

According to particular features, to determine the transition probability, a candidate packet is selected for which the probability constitutes an extremum of the probabilities corresponding to the various candidate packets and the probability corresponding to the selected candidate packet is compared to a predetermined limit value.

According to particular features, during the step of determining a transition probability, determination is made of a probability that two different loss distribution laws exist on respective opposite sides of the candidate packet, said extremum being a maximum.

According to particular features, during the step of determining a transition probability, determination is made of a probability that the same loss distribution law exists on respective opposite sides of the candidate packet, said extremum being a minimum.

By virtue of each of these provisions, determination is made not only of the existence of a transition between the loss distribution laws but also the time at which the transition is assumed to have taken place, which makes possible the iterations discussed above.

According to particular features, during the step of determining a probability, a Wilcoxon test is carried out.

According to a sixth aspect, the present invention concerns a method of protecting data against losses at the time of their transmission over a communication network, characterized in that it includes:
- a step of detecting a transition between rates of packet loss according to the present invention as succinctly set forth above,
- a step of determining a redundancy level based solely on the period of time elapsed since the last transition, and
- a step of generating redundant data the level of which depends on the level of redundancy determined during the determining step.

The method of this aspect of the present invention provides better performance than the methods of the state of the art, because the segmentation of the record is carried out into homogeneous regions, on the basis of detections of transitions. The last region detected has a homogenous statistical distribution and the parameters of the error correcting codes are determined solely on the basis of that last region. Consequently, the parameters of the error correcting codes correspond to the most recent state of the network and not to an arbitrary weighting.

To be precise, the calculation of the redundancies for the error correcting codes is better if it takes into account the losses resulting from the last variation in the error rate than if it takes into account losses arising from different loss rates.

Thus, the match between the protection of the data and the occupancy of the bandwidth is better.

According to particular features, said redundancies comprise error correcting codes.

According to particular features, said packets are IP/RTP packets (IP/RTP being an acronym for "Internet Protocol/Real-time Transport Protocol").

According to particular features, during the step of determining the redundancy level, said redundancy level is determined by a client and transmitted to a data server.

According to particular features, during the step of determining the redundancy level, the level of redundancy is determined on the basis of the maximum loss rate determined for a period of time separating two detected transitions.

According to particular features, during the step of determining the redundancy level, for each of a plurality of redundancy level candidate values, determination is made of a residual loss rate after restoration of the data truly lost since the last transition by simulating the implementation of the candidate redundancy level value and that residual loss rate is compared to a target value.

According to a seventh aspect, the present invention concerns a device for detecting transition between two states of a communication network corresponding to different loss rates of sent data, characterized in that it includes:
- a means for determining a probability of transition and
- a means for determining the existence of a transition on the basis of said probability.

According to an eighth aspect, the present invention concerns a device for protecting data against losses at the time of their transmission over a communication network, characterized in that it includes:
- a device for detecting a transition between packet loss rates as succinctly disclosed above,
- a means for determining a redundancy level based solely on the period of time elapsed since the last transition, and
- a means for generating redundant data the level of which depends on the level of redundancy determined during the determining step.

According to a ninth aspect, the present invention concerns a computer program loadable into a computer system, said program containing instructions enabling the implementation of the method of the present invention, as succinctly set forth above.

According to a tenth aspect, the present invention concerns an information carrier readable by a computer or a microprocessor, removable or not, storing instructions of a computer program, characterized in that it enables the implementation of the method of the present invention, as succinctly set forth above.

As the particular advantages, objects and features of this device, of this program and of this information carrier are similar to those of the methods of the present invention, they are not reviewed here.

BRIEF DESCRIPTION OF THE DRAWINGS

Other advantages, objects and features of the present invention will emerge from the following description, given, with an explanatory purpose that is in no way limiting, with respect to the accompanying drawings, in which.

DESCRIPTION OF THE EMBODIMENTS

Figure 1:
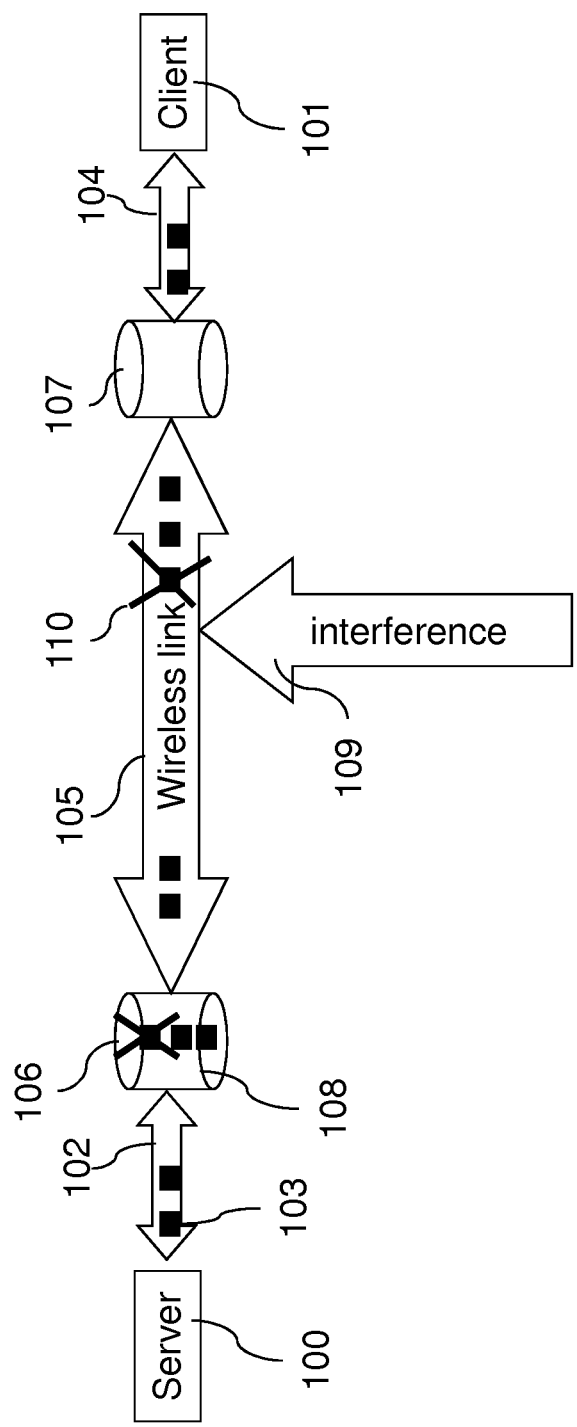
FIG. 1 is a diagrammatic representation of two types of data losses that may occur on transmission of data from a server to a client.
Figure 2:
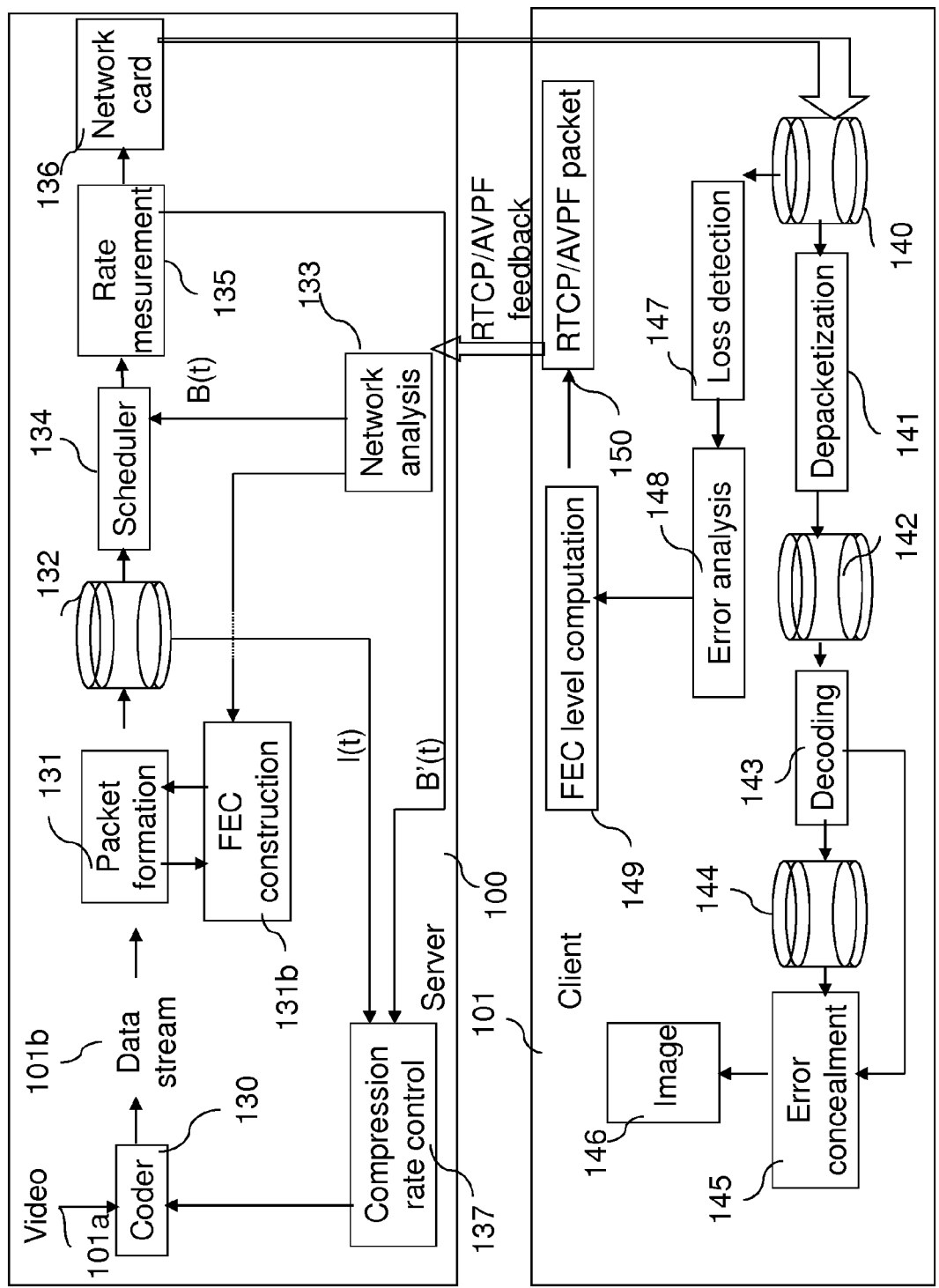
FIG. 2 is a block diagram representation of different functions performed by elements of a server and of a client, for the transmission of data packets.

FIGS. 1 and 2 illustrate a context in which the present invention may be used. In this context, a codestream is transmitted over a network between a sender device, or server, 100 and at least one recipient device, or client, 101. In the interest of clarity, a single client 101 is represented in the drawings. The data stream concerns video data to transmit in real time. These data are compressed by a video encoder 130 (FIG. 2) to form the data stream. This stream is transmitted by the server 100 in the form of data packets which are sent to each recipient client 101.

The server 100 transmits the data in the form of IP/RTP packets 103 over a first link of the network 102. This first link may be wired or wireless. It is assumed here that it is wired. The links of the network, in usual manner, connected to routers 106 composed of a queue (buffer memory) which stores the packets received by the router 106 before retransmitting them over another link. In FIG. 1, a second link 105 is assumed to be a wireless link. If the transmission capacity of the second link 105 is less than the transmission capacity of the first link 102, IP packets may be lost in case the queue of the router 106 fills up. For example, the packet 108 may be lost in this way. Such losses are termed "congestion errors". On account of the high level of occupancy of the queue in the router 106, the transfer time of a packet is thus increased. In case of congestion, the overall transmission time, or "ROTT" (for "Relative One-way Trip Time"), of a packet between the server 100 and the client 101 is increased.

Moreover, the wireless link 105 is subject to interference 109. For example, microwaves may pollute link 105. In this case, packets, for example the packet 110, may be lost. The time between two losses due to interference is usually higher than the time between two congestion losses. It is possible for the losses to be close, or even consecutive.

In FIG. 1, wireless link 105 is connected, via a router 107, to a wired link 104, through which the packets are transmitted to a client 101. If no protection for the data is provided, the video packets that are not received cannot be restored by the client. On account of these absences, the quality of the video is poor at the client 101. It is thus preferable for the video server 100 to add redundant data, in particular FEC error correcting codes, to the video data packets. These redundant data packets serve to restore the missing video data packets.

In FIG. 2, the packets are constituted by a packetizer 131 from the stream 101b encoded by the encoder 130. Additional packets of FEC error correcting codes are computed by a module 131b. These packets may be constructed by a Reed-Solomon algorithm, or an "XOR" algorithm, before being encapsulated in the form of RTP packets by the packetizer 131. To know the generation of packets in detail, the reader may refer to the examples known under the names of RFC-2733 and RFC-5109.

The network packets formed by the packetizer 131 are stored in a buffer memory 132. In the context illustrated in FIGS. 1 and 2, the communication network is a packet switching network. The protocol used for the transport of the data in this type of network is, for example, RTP (for "Real-time Transport Protocol").

Each data packet comprises two parts. The first part corresponds to data representing the start of the packet or a network header, for example an RTP header. The second part corresponds to the payload comprising the data of the data stream to transmit. The network header comprises the information concerning, for example, the sequential number of the network packet, which represents an index of the packet in the order of sending (also called "sequence number" for an RTP packet).

A scheduler 134 adapts the packet transmission rate, or throughput, depending on a target bandwidth given by an analysis module 133. The analysis module 133 analyzes the network packets sent back by a client, which are termed "RTCP/AVPF" (for "Real-Time Transport Control Protocol/ Audio-Visual Profile with Feedback") packets. For example, the congestion rate loss may be transmitted by the client via RTCP packets and used by the analysis module 133. On the basis of this analysis, the packet transmission rate is deduced and, consequently, the bandwidth is estimated.

If the number of packets lost on account of congestion events is high, the transmission rate is reduced. This information concerning the transmission rate or bandwidth B(t) is transmitted to the scheduler 134.

When the data stream concerns a real-time video transmission, the analysis module 133 may be a TFRC module.

Thus, on the basis of the analysis of the network, control of the network congestion is provided, by adapting the packet transmission rate. This analysis makes it possible to optimize the outgoing packet rate and, consequently, to use the bandwidth of the network efficiently, while reducing the risk of congestion in the network.

A network card 136 performs the task of transmitting the network packets over the communication network. The network packets are adapted to the format used over the network. For example, in the case of a network implementing IP ("Internet Protocol"), the packets are formed into UDP ("User Datagram Protocol") packets as well as in the form of IP packets.

The RTCP/AVPF packets may also transport the information concerning the FEC redundancy packets for the FEC redundancy packet construction module 131*b*. According to the transmission rate of the packets and the filling level of the buffer memory 132, the compression rate is controlled by compression rate control means 137. A rate measurement module 135 measures the transmission rate of the network at the network card 136. This measurement B'(t) is transmitted to the compression rate control means 137. Thus, if the available bandwidth is suddenly reduced, the network card 136 transmits the network packets more slowly and the compression rate is adapted to the new transmission rate. This new transmission rate value, or bandwidth B'(t), is measured by the measurement module 135 and transmitted to the compression rate control means 137, which acts on the video encoder 130 to increase or decrease the size of the data stream 101*b* generated. If the compression rate control means 137 order reduction in the size of the data stream, the video encoder 130 (for example of MPEG type, MPEG being an acronym for "Moving Pictures Expert Group") increases the compression rate of the original video, which may result in visual effects such as block effects.

It is to be noted that, when the value of the available bandwidth is constant, the value of the bandwidth B(t) estimated by the network analysis module 133 is similar to the bandwidth B'(t) measured by the rate measurement module 135.

A client 101 receives the network packets from the communication network and stores them in a buffer memory 140. The client 101 analyzes the sequential numbers of each of the RTP packets to identify the lost packets. The packets are depacketized by a depacketizer 141. To "depacketize" a packet consists in removing the packet header and in assembling the payload data of the packets to form a new data stream that the client stores in a buffer memory 142. The data stream is next decoded by a decoder 143 and the images of the video are obtained. These images are stored in a buffer memory 144.

If network packets are lost, an error concealment module 145 performs interpolation to provide the missing data of an image. This image correction method may be, for example, a spatial interpolation, when the type of image is INTRA, and a temporal interpolation when the type of image is INTER. Once this method has been implemented, the image is displayed by display means 146.

In embodiments of the invention the FEC RTP packets may be used to correct the data packets which have been detected as lost. The RTP header of the FEC packets is eliminated by the depacketizer 141 and the content of those packets is used in conjunction with certain received RTP data packets to restore lost packets. Most of the lost RTP data packets are thus corrected.

Furthermore, a loss detection module 147 analyses the packets stored in the buffer memory 140 to detect whether packets have been lost during the transmission over the network. The loss of a packet may be detected by analysis of the sequence numbers of the received packets.

The sequential numbers of the lost packets may be used by two modules:
- the module for computing the bandwidth between the server and the client, for example, a TFRC type estimation module, 133 may be used, and
- the FEC redundancy control module 148 which aids in the determination of the FEC redundancy level.

As TFRC is well known to the person skilled in the art, the TFRC module for computing the bandwidth is not described here. It is however noted that this module sends back information, via the module 150, to the server 100 in order for the server 100 to be able to compute the available bandwidth. More particularly, when losses due to a congestion are detected, the information sent back enables the server 100 to reduce the outgoing rate.

Module 148 may be employed to implement an embodiment of the present invention. The role of this analysis module 148 in this embodiment is to store the sequence numbers of the lost RTP packets and to send that list of sequence numbers to a module 149. The module 149 receives a list of sequence numbers, determines a loss rate and calculates an FEC redundancy level which corresponds to that loss rate. The level of redundancy is sent to the analysis module 133 of the video server 100 in RTCP/AVPF packets 150 and is used by the module 131*b* of the server 100 to calculate the appropriate FEC redundancies (calculation of the redundant packets).

It is to be noted that, for the RTP packets, the sequence number, coded over two bytes, is between "0" and "65535". It is assumed in the following part of the description that the sequence number may take any value between 0 and infinity. Thus, if the client 101 receives a sequence number equal to "65535" then a sequence number equal to "0", it translates the second into 65536.

It is to be noted that the transmitted sequence number list may be very large. Furthermore, the lost packet sequence numbers may arise from different loss regimes occurring at different times. Preferentially, only the sequence numbers that correspond to the current period of time having a homogenous loss rate are transmitted to the module 149. In some embodiments of the present invention, the module 148 performs this task by selecting, on the basis of a list of lost packets, the packets which correspond to the same statistical distribution over a given period of time.

In the embodiment illustrated in FIG. 2, the module 148 rapidly determines the transitions between statistical loss distributions and, consequently, determines periods of time that are homogeneous in terms of loss distribution laws.

This functionality has various applications, for example:
- to evaluate the transmission conditions over a network, and
- to adapt the level of FEC redundancy on the basis of the distribution law determined for a homogenous period of time.

In the embodiment illustrated in FIG. 2, the adaptation of the redundancy level is performed by the server 100, in accordance with information feedback from a client 101. It is however to be noted that, in some embodiments, the adaptation is made on the basis of one of the preceding homogeneous periods of time, in particular that having the maximum loss rate.

Module 148 may be employed to implement a particular embodiment of the method of the present invention. In this particular embodiment the module 148 constructs a database which characterizes the different states of the network during an elapsed period of time. On the basis of the content of that database, module 148 supplies indications to module 149, which are utilized to compute the FEC redundancy rate and transmit it to the video server 100 via RTCP/AVPF packets transmitted by module 150.

The FEC packets received may also be used to correct the data packets which have been lost. However, in the interest of clarity in FIG. 2, this module for correcting data packets by FEC packets is not represented.

Figure 3:
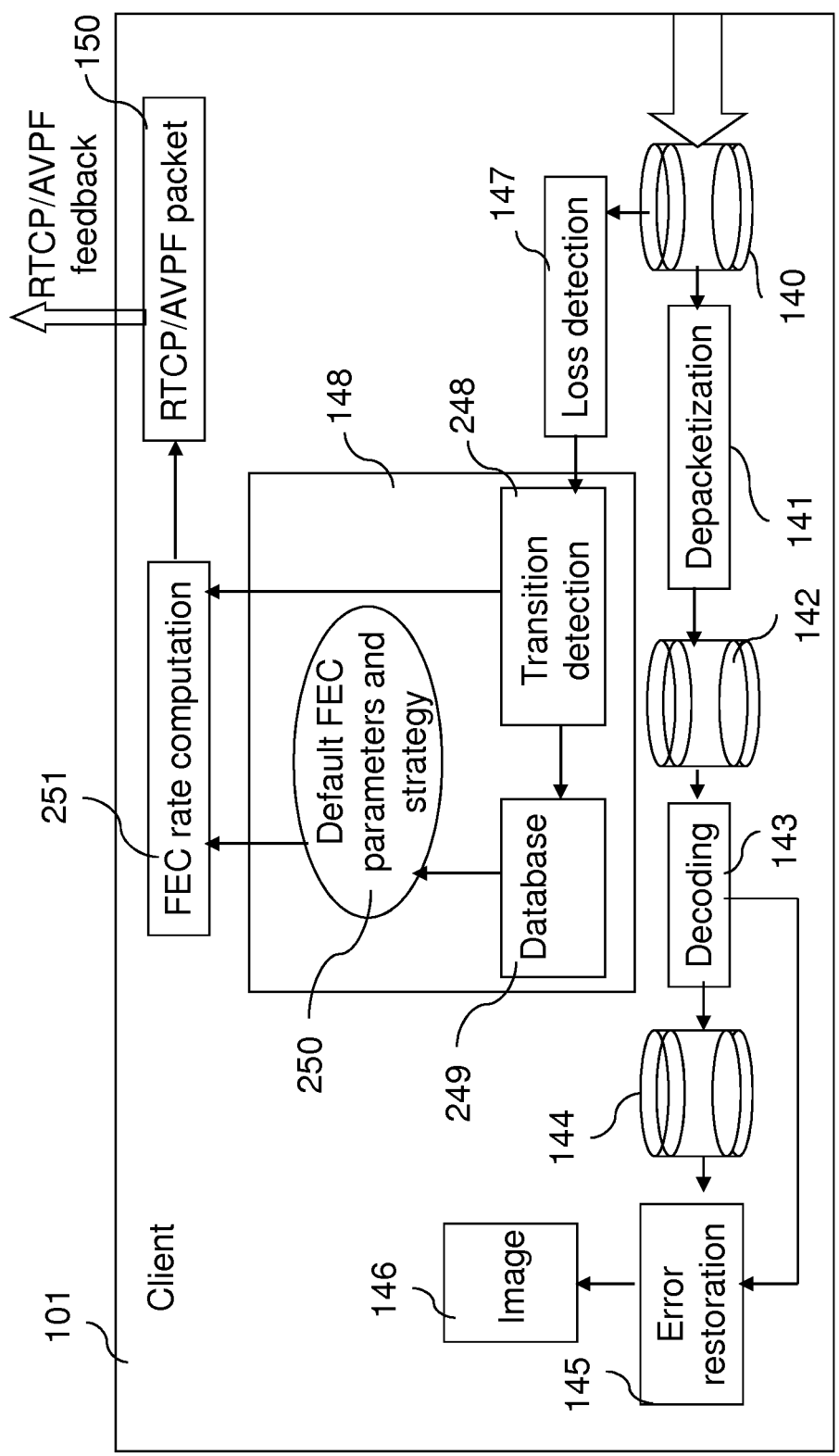
FIGS. 3 and 4 are block diagram representations of a particular embodiment of means implemented by the method of the present invention.

FIG. 3 represents a client 101 in which an embodiment of module 148 is detailed. In this embodiment the module 148 comprises three elements 248, 249 and 250. Element 248 is a module which detects the transitions in the distribution law for lost packets that are detected by module 147. This module 248 is described below with reference to FIGS. 12 to 14.

Figure 12:
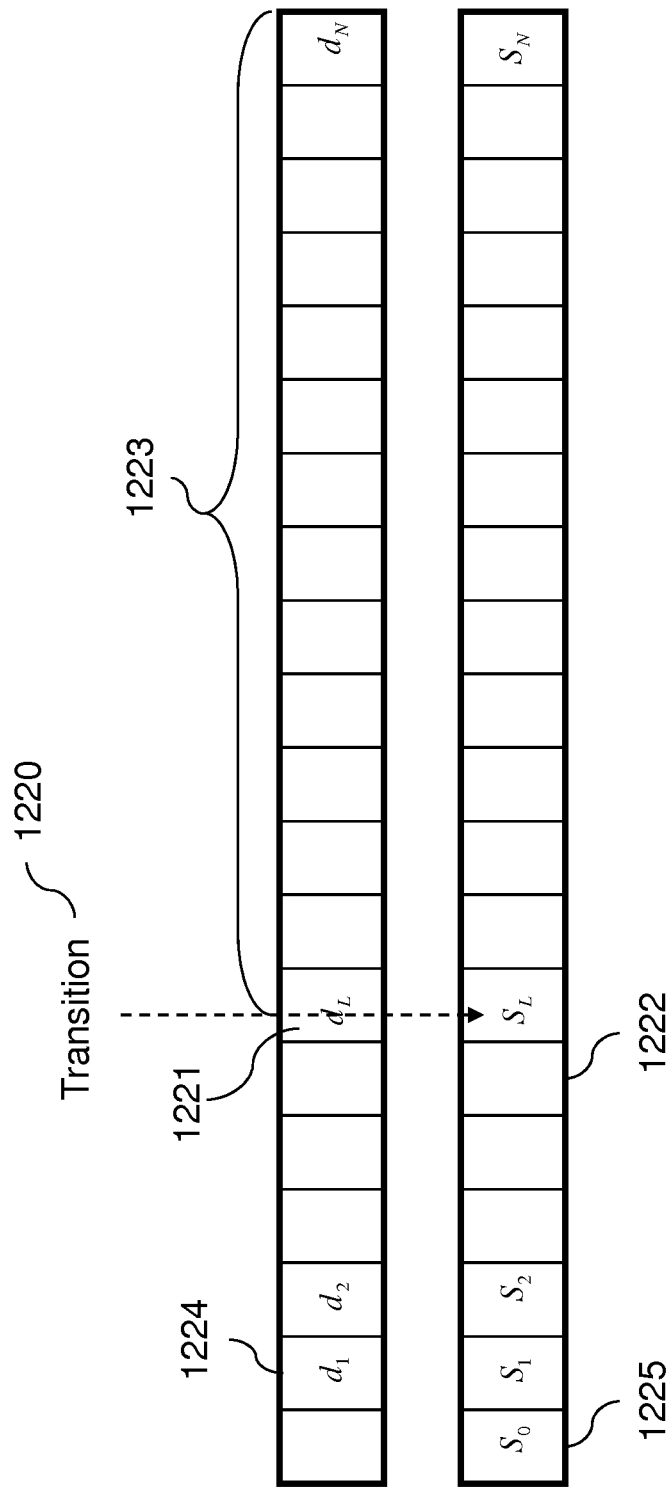
FIG. 12 is diagrammatic representation of contents of memories for the implementation of the steps illustrated in FIG. 5 or 16.

The detection of a transition is preferentially made solely on the basis of difference between sequential numbers subsequent to the last transition detection. FIG. 12 illustrates this manner of operation. The buffer memory 1225 stores the sequential numbers of lost packets. The sequential numbers may for example be the header sequence numbers of the RTP packets. The buffer memory 1224 stores the differences in sequential numbers between lost packets.

Let it be assumed that the last transition 1220 detected between distribution laws corresponds to the lost packet 1222 and to the difference d 1221 in sequential numbers. The set of differences in sequential numbers that is used to determine a possible new transition, corresponds to the differences subsequent to the difference 1221. In other words, only the differences 1223 are used to detect a possible new transition.

Figure 13:
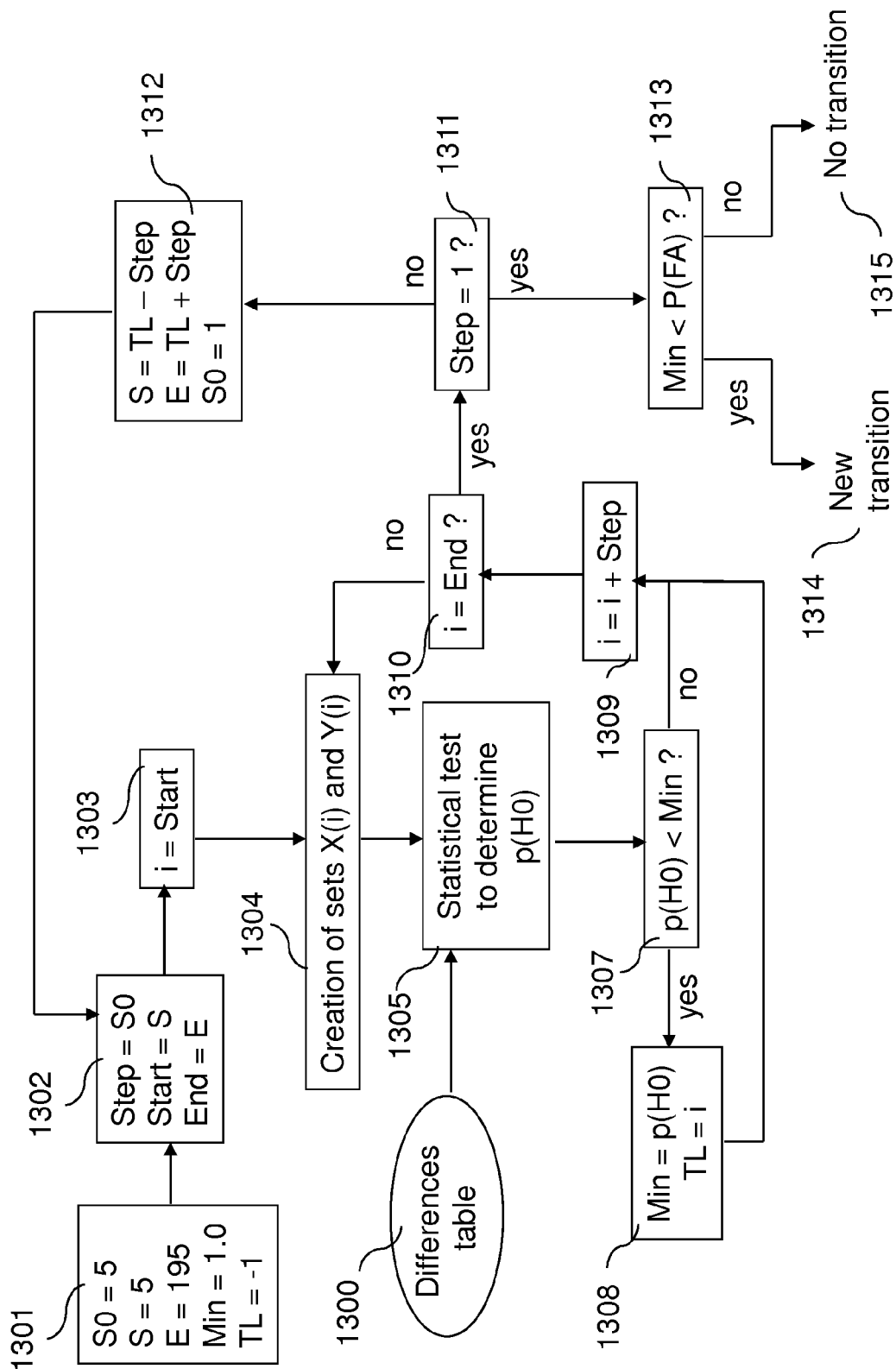
FIG. 13 is a flow diagram representation of steps implemented in a step illustrated in FIG. 5 or 16.

FIG. 13 describes how the transitions are detected. As input a set of differences in sequential numbers is provided, or, preferentially, the subset of the differences in sequential numbers of the lost packets that are subsequent to the last detected transition. This input takes the form of a table 1300. The object of the steps illustrated in FIG. 13 is to detect whether a transition has taken place and, if yes, at what sequential number it is located.

Figure 14:
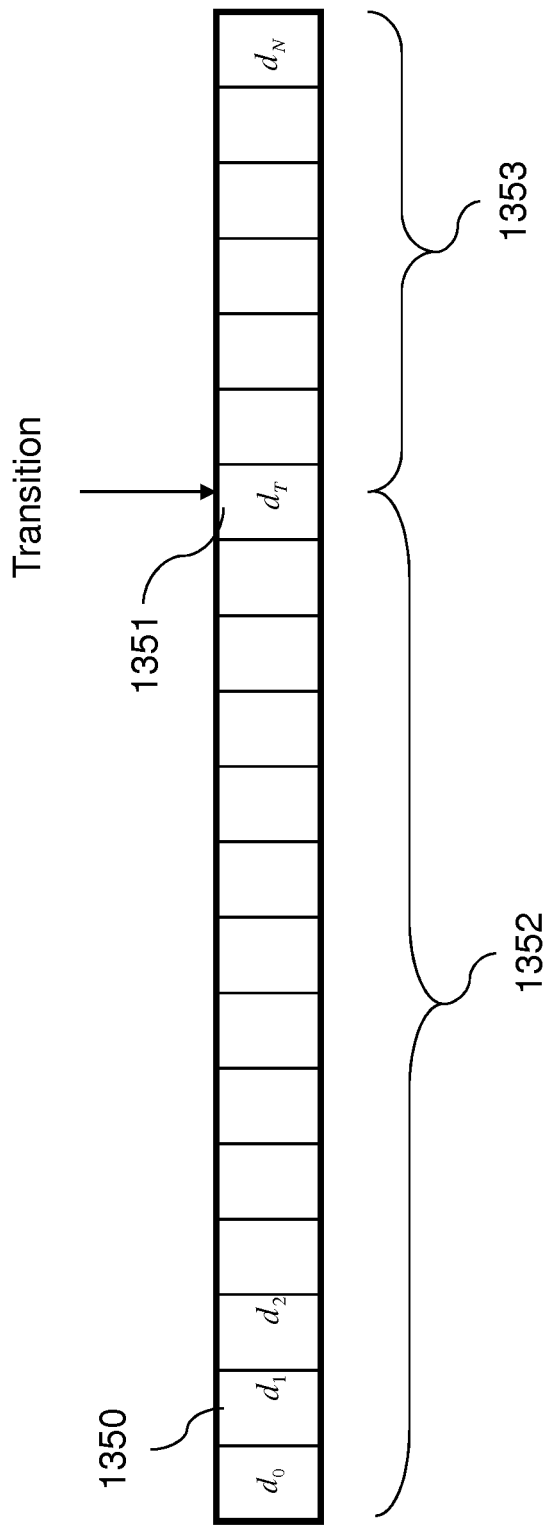
FIG. 14 is a diagrammatic representation of a memory content for the implementation of the steps illustrated in FIG. 13.

The result of this transition detection is represented in FIG. 14. The initial table of differences in sequential numbers 1351 is split therein into two parts, 1352, for the numbers prior to the detected transition and 1353 for the numbers that are subsequent. The point separating these two parts is the transition position 1351. This point is that at which the probability that two different distribution laws exist on respective opposite sides of that point is maximum. Conversely, this point is that at which the probability that the two sets of differences belong to the same distribution law is the lowest. It is this second property that is implemented in the algorithm illustrated in FIG. 13.

In this FIG. 13, two successive phases are implemented. The first phase consists of finding an approximation of the possible transition position. The second phase consists of increasing the accuracy for the position of the possible transition. During a step 1301, a set of variables is initialized. "S0" represents the accuracy of the transition position. S0 is initialized to the value "5". This means that the table of differences is first of all treated five differences by five differences. The starting point "S" in the table is thus equal to "5". The end point "E" in that table of differences is E=195. E corresponds to the number of differences in the table, assumed here to be equal to 200, less five. The position "TL" of the assumed transition is initialized to the value TL=−1. The variable "Min" which corresponds to a minimum probability, takes the value 1.0.

During a step 1302, the variables of the algorithm of the first phase are initialized on the basis of the values initialized during step 1301. The variable "step" takes the value of "S0". The variable "start" takes the value of "S" and the variable "end" takes the value of E. In what follows, the algorithm attempts to separate the differences table into two sets, one in an interval [0, i], and the second in an interval [i, TS] where TS is the number of differences in the differences table. The probability that these two sets of differences correspond to the same distribution law is computed. By using different candidate values of "i", the candidate value which gives the lowest probability is selected as the position of a possible transition. It is next determined whether a transition has actually taken place.

During a step 1303, the value of the variable "i" is initialized to the value of the variable "Start". During a step 1304, two sets of differences are generated, "X(i)" and "Y(i)". For example, with reference to FIG. 14, these two sets respectively correspond to the intervals of differences 1352 (differences prior to the position tested) and 1353 (differences subsequent to the position tested).

During a step 1305, a statistical test is carried out to evaluate the probability p(H0) that the two sets X(i) and Y(i) correspond to the same distribution. During a step 1307, a test is carried out to determine whether p(H0)<Min, that is to say whether p(H0) is the lowest probability of the set of probabilities already computed. If so, during a step 1308, the new transition position is the value of "i" and "Min" takes the value p(H0). If the result of step 1307 is negative or further to step 1308, during a step 609, the value of "i" is incremented by the value of "Step" (5 during the first phase). During a step 1310, it is determined whether "i" is less than the value of "End". If not, step 1304 is returned to. On the contrary, if so, during a step 1311, it is determined whether the value of "Step" is equal to "1". If not, that is to say if the second phase is not finished, during a step 1312, new values are attributed to "S", S=TL−Step, "E", E=TL+Step and "S0", S0=1. Next, step 1302 is returned to in order to perform the second phase by testing candidate values of "I" around the value obtained during the first phase.

If the value of the variable Step is "1", during a step 1313, it is determined whether the value of the variable "Min" is less than a predetermined probability of "false alarm" P(FA). If yes, a new transition has been detected and is located at the position given by the value of the variable "TL". Otherwise, no transition has been detected.

A description will now be given of a statistical test example which may be performed during the step 1305. This test is known by the name "Wilcoxon" test. It makes it possible to estimate the probability that two sets of samples correspond to the same statistical law. Two sets are started with (set of differences between sequential numbers of consecutive lost packets, before and after a candidate transition position, in the case represented in FIG. 12). The first set comprises N samples. The second set is composed of M samples. Two hypotheses are posed:
  the hypothesis "H0" whereby the two sets come from the same probability distribution, and
  the hypothesis "H1" whereby the two sets come from two different probability distributions.

The statistical test evaluates the probability H0: p(H0). The second hypothesis is selected if p(H0) is less than a predetermined limit value. In the case of FIG. 13, the limit value may be 0.00001.

In the "Wilcoxon" test, the values of the two sets of samples are first of all placed in increasing order. Next, a rank is attributed to each sample depending on its position in the increasing order. Next, the sum of the ranks of the values of the elements of the first set is processed. There are two possibilities:

either N and/or M are high, for example greater than or equal to 10,
or N and M are low.

In the first case, a value of which the formula is $$\frac{S - N(N + M + 1)/2}{\sqrt{NM(N + M + 1/12)}}$$

is computed and follows a Gaussian distribution (average of 0 and variance of 1) if the samples of the two sets follow the same statistical law.

In the second case, the sum of the ranks $$S = \sum_{i=1}^{N} r_i$$

for the first set follows the simple law $$P(S = m) = \frac{k_m}{C_{N+M}^{N}}$$

with $k_m$ being the number of n-tuples the sum of which equals m and $$C_n^k = \frac{n!}{n!(n-k)!},$$

"x!" being the factorial function of "x".

Consequently, if both sets of samples arise from two different distributions, the computed values are very low. If both sets of samples arise from the same distribution, the computed values are high.

Returning to FIG. 3, element 249 constructs a learning database 402 (FIG. 4) which may be viewed as characteristic of the network during a given period of time. Each time a transition is detected by the element 248, a new entry is made in the learning database 402. This entry corresponds to the period of time which ends with the last detected distribution law transition and begins with the previous transition.

Depending on the database updated 402, two parameter values are computed:
an FEC redundancy rate value fixed by default and
an adaptive value corresponding to the strategy for computing the level of protection by FEC redundancies.

Element 250 comprises these two parameter values, which are used by a module 251 for computing the FEC redundancy rate.

Figure 4:
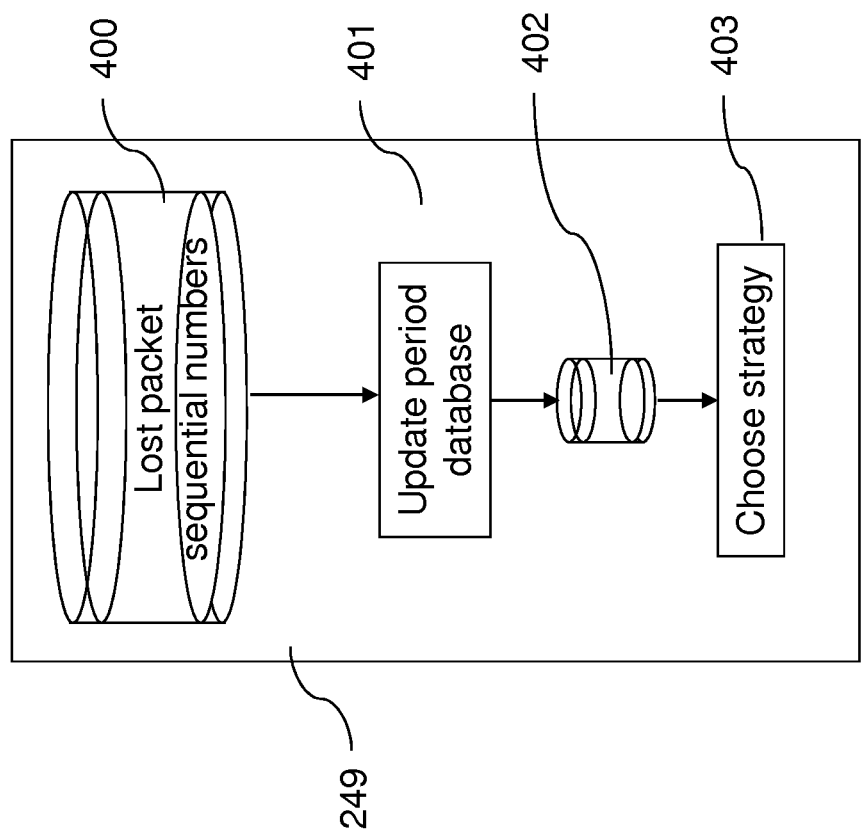

The manner in which the learning database 402 is constructed is illustrated in FIG. 4. The manner in which the FEC redundancy rate is computed and used is set out with reference to FIG. 8.

Thus, the modules 249, 250 and 251 make it possible to detect, on the basis of an analysis of the past, whether an adaptation of the protection by FEC redundancies, that is a local adaptation in temporal terms, may be used during periods of congestion.

The advantage of automatically detecting whether a local adaptation is possible is that this makes it possible to compute the best proportion of FEC redundancy packets while ensuring a good level of protection for the packets of payload data.

As the proportion of FEC redundancies is optimal, because the quantity of FEC redundancy packets is minimized and because, therefore, the quantity of video payload data packets may be increased, the compression rate of the video is lower and the visual quality rendered is improved.

FIG. 4 gives more detail on the constitution of module 249 illustrated in FIG. 3. Reference 400 concerns a buffer memory which contains the sequential numbers of the lost RTP packets. It is to be recalled that the sequential numbers may, for example, correspond to the sequence numbers indicated in the header of the RTP packets. The sequential numbers of the RTP packets received by the client 101 are located in module 147 (FIGS. 2 and 3) On the basis of these sequential numbers, the sequential numbers of the lost packets are determined. The sequential numbers of the lost packets are stored in the buffer memory 400. This list of lost packet sequential numbers is utilized by an updating module 401 which constructs a database 402 which characterizes the past behavior of the network. This database 402 is called "periods database". This database 402 is used by the module 403 which makes a choice of strategy after having determined the two parameter values that are a value of the FEC redundancy rate fixed by default and an adaptive value.

Figure 5:
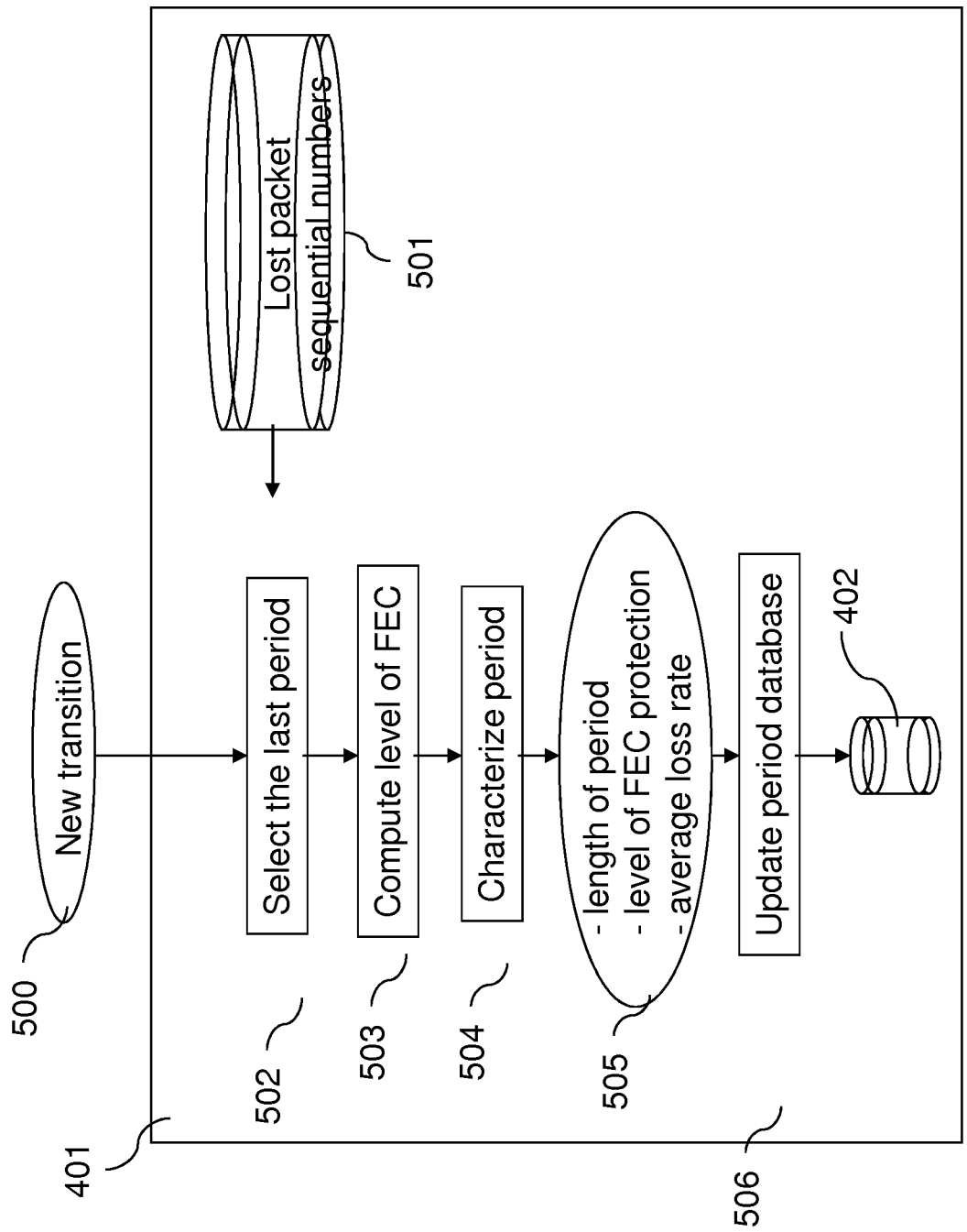
FIGS. 5 and 6 are flow diagram representations of the steps implemented in a particular embodiment of the method of the present invention.

The manner in which the database 402 is updated is set out with reference to FIG. 5. The manner in which the choice of strategy is made is set out with reference to FIG. 6.

As illustrated in FIG. 5, the database 402 is updated each time a new transition between distribution laws for losses over the network is detected by module 248 during a step 500. For this new transition, the sequence numbers of the lost packets corresponding to the last period of time between two transitions are selected during a step 502. The last period of time between two transitions is that which runs up to the new detected transition and starts from the previous one.

It is noted that, in the memory 501 for lost packet sequential numbers, the numbers may be stored with their temporal information (the date at which the packet loss is detected), which enables the appropriate sequential numbers to be selected easily, during step 502. On the basis of the sequential numbers of the lost packets, the FEC redundancy level which makes it possible to protect the packets of payload data from the period of time selected may be computed during a step 503. The manner in which the FEC redundancy rate is computed is set out with reference to FIG. 9.

The last period of time selected may be characterized during a step 504 on the basis of the FEC redundancy rate. For example, this period of time characterization is illustrated at 505 by:
the length of the period of time,
the level of FEC redundancies, and
the average loss rate.
It is noted that other parameter values could be used.

As regards the FEC redundancies, of which the level corresponds to the value of the parameter for the algorithm for constructing error correcting codes to protect the payload data packets, the algorithm used is, for example, "XOR FEC". If an FEC redundancy packet is generated for n packets of payload data, the level of protection (or redundancy rate) has the value 1/n.

Once the last period of time has been characterized, the characterization information is stored, during a step 506, in the periods of time database 402. This database 402 contains the characterization information for different homogeneous periods of time since, between two transitions the loss distribution law is stable.

Figure 6:
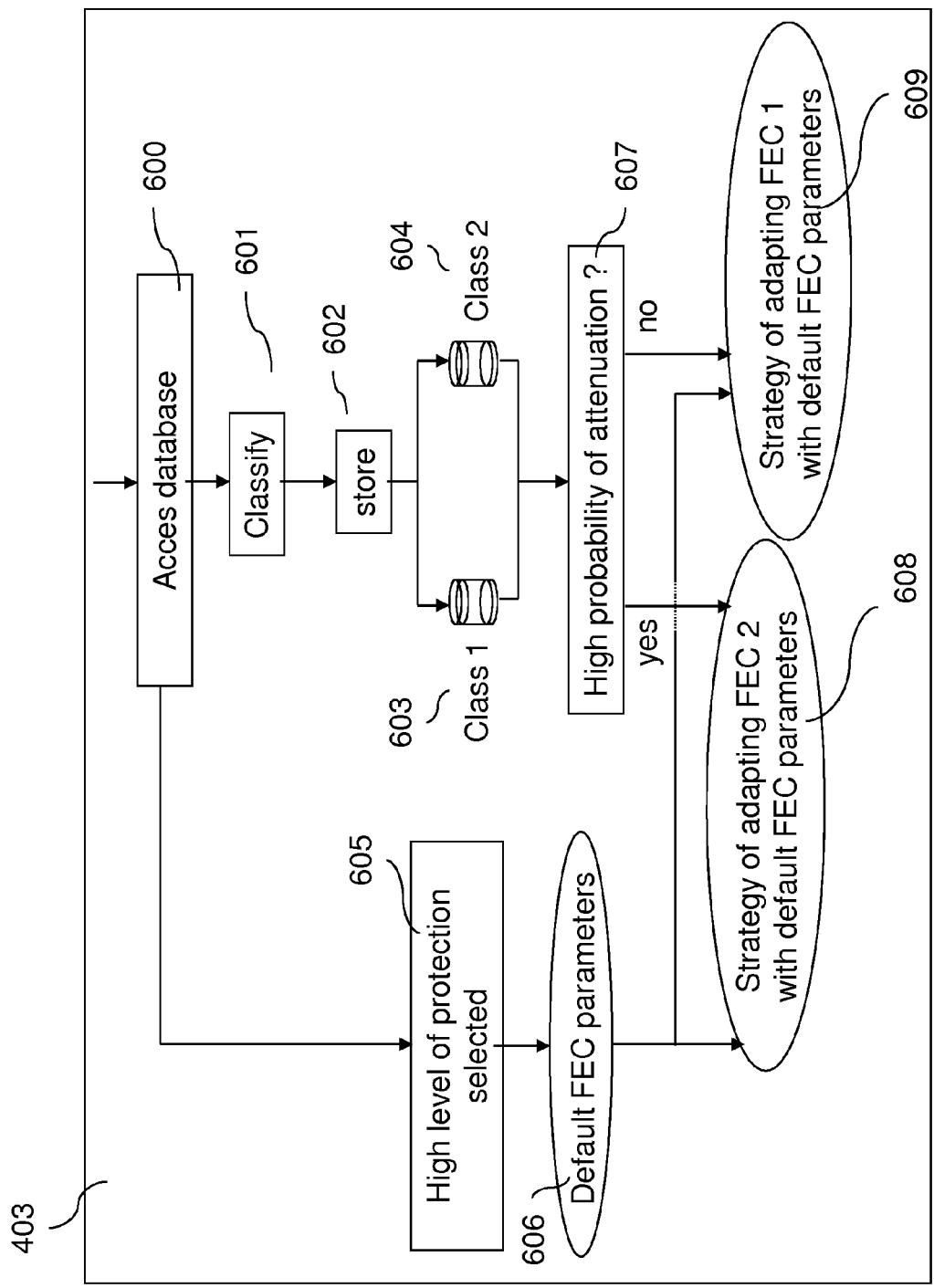

FIG. 6 describes step 403 illustrated in FIG. 4. The object of this step is to define a strategy, here between two possible strategies, for the module 251 for computing the rate of error correcting codes illustrated in FIG. 3. A default FEC parameter value corresponding to a fixed level of protection is associated with the selected strategy. During a step 600, the periods of time database 402 is accessed. During a step 601, the periods of time read in that database 402 are classified into two classes. The first class corresponds to the period of time with a high level of FEC protection (or a high average loss rate). The second class corresponds to the periods of time for which the level of protection by FEC is low (the average loss rate is low).

The indices of the periods of time are stored, during a step 602, in two buffer memories 603 and 604. The buffer memory 603 contains the indices of the periods of time of the first class. The memory 604 contains the indices of the periods of time of the second class.

In parallel, during a step 605, the period of time which requires the highest redundancy rate is selected from the periods of time database 600. The level of protection (or protection rate) computed for that period of time, termed 1/n in the drawings, will be the FEC parameter value by default (that is to say that an FEC packet will be generated for n data packets). This default value will be used either for the first strategy, during a step 609, or for the second strategy, during a step 608. Of course, the manner of using this value parameter differs according to the strategy implemented.

In the described embodiment, the default protection rate corresponds to the protection for the period having the highest loss rate, whatever the class. In the first strategy, a fixed protection rate is implemented equal to the default protection rate. The second strategy comprises implementing:

for the future homogeneous periods of time corresponding to the periods of time that suffered the least losses, which are periods of the second class, a fixed protection rate equal to the default protection rate and for the homogeneous future periods of time corresponding to the periods of time that suffered the most losses, which are periods of the first class, a variable protection rate.

During a step 607, a probability of alternation between the two classes is computed. A high value for this probability of alternation means that two consecutive periods have a high probability of belonging to two different classes. A low parameter value means, on the contrary, that it is probable to have the same class over two consecutive periods of time.

The manner in which this probability of alternation is computed is described with reference to FIG. 10. If the value of this probability of alternation is high (for example greater than 95%), the second strategy is adopted. If the value of this probability of alternation is low, the first strategy is adopted.

The advantage of this choice is the following. If the alternation of periods of time is high, this means that most of the time, a period with a high loss rate, corresponding to a period of congestion, is followed by a period with a low loss rate. Consequently, even if the FEC redundancy level is adapted to the current loss rate of a period of congestion (by making the FEC redundancy decrease as much as possible while ensuring a good level of protection of the data packets), the probability of apparition of a new event of high congestion for which correction may not be possible with the current protection by FEC is low. The use of the high probability of alternation makes it possible to detect the conditions in which the strategy of adapting the FEC redundancies is possible, which enables a low average compression rate for the video at the server.

Figure 8:
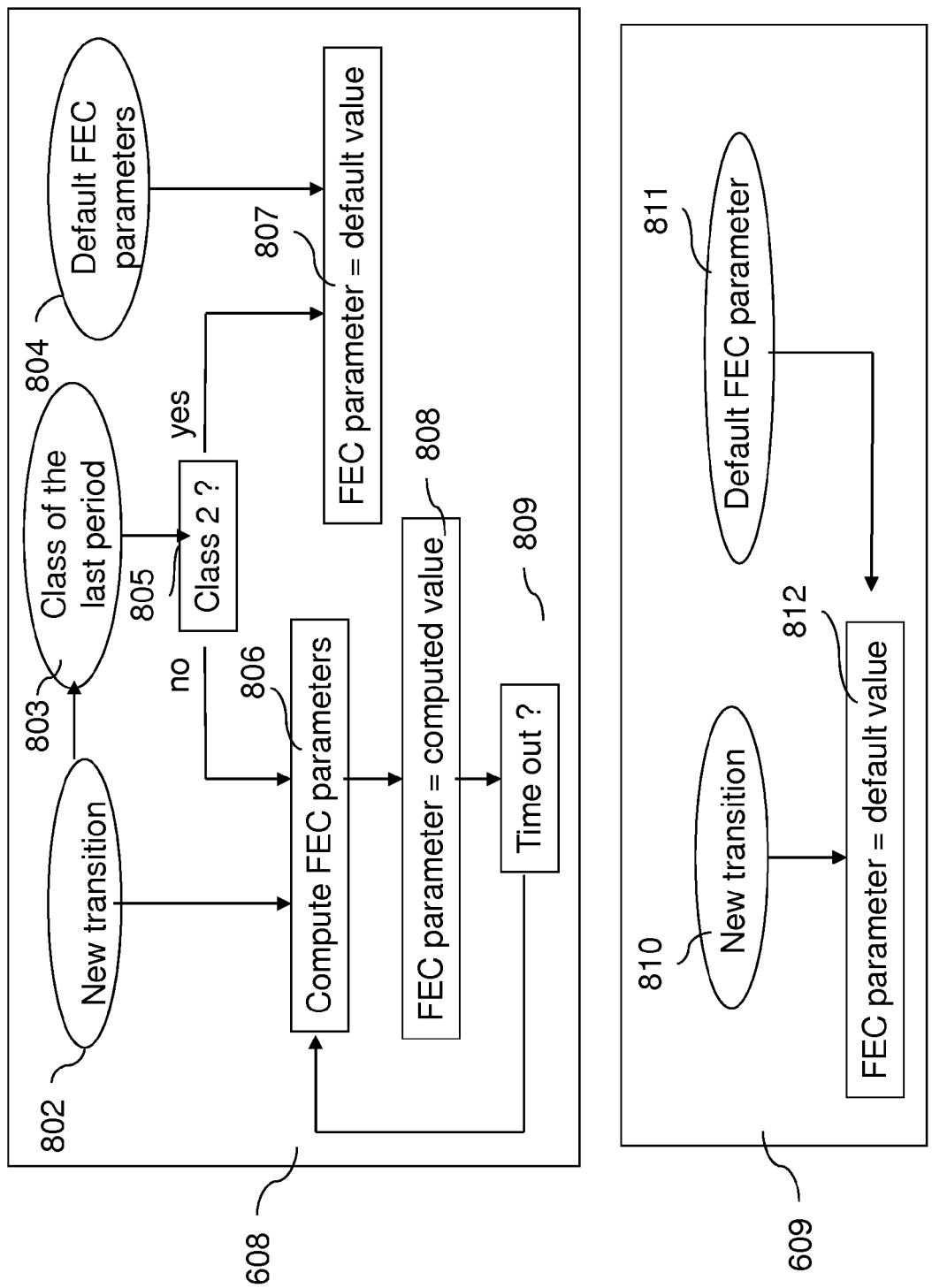
FIG. 8 is a flow diagram representation of steps implemented in steps illustrated in FIG. 6.

The different strategies are set out with reference to FIG. 8.

Figure 7:
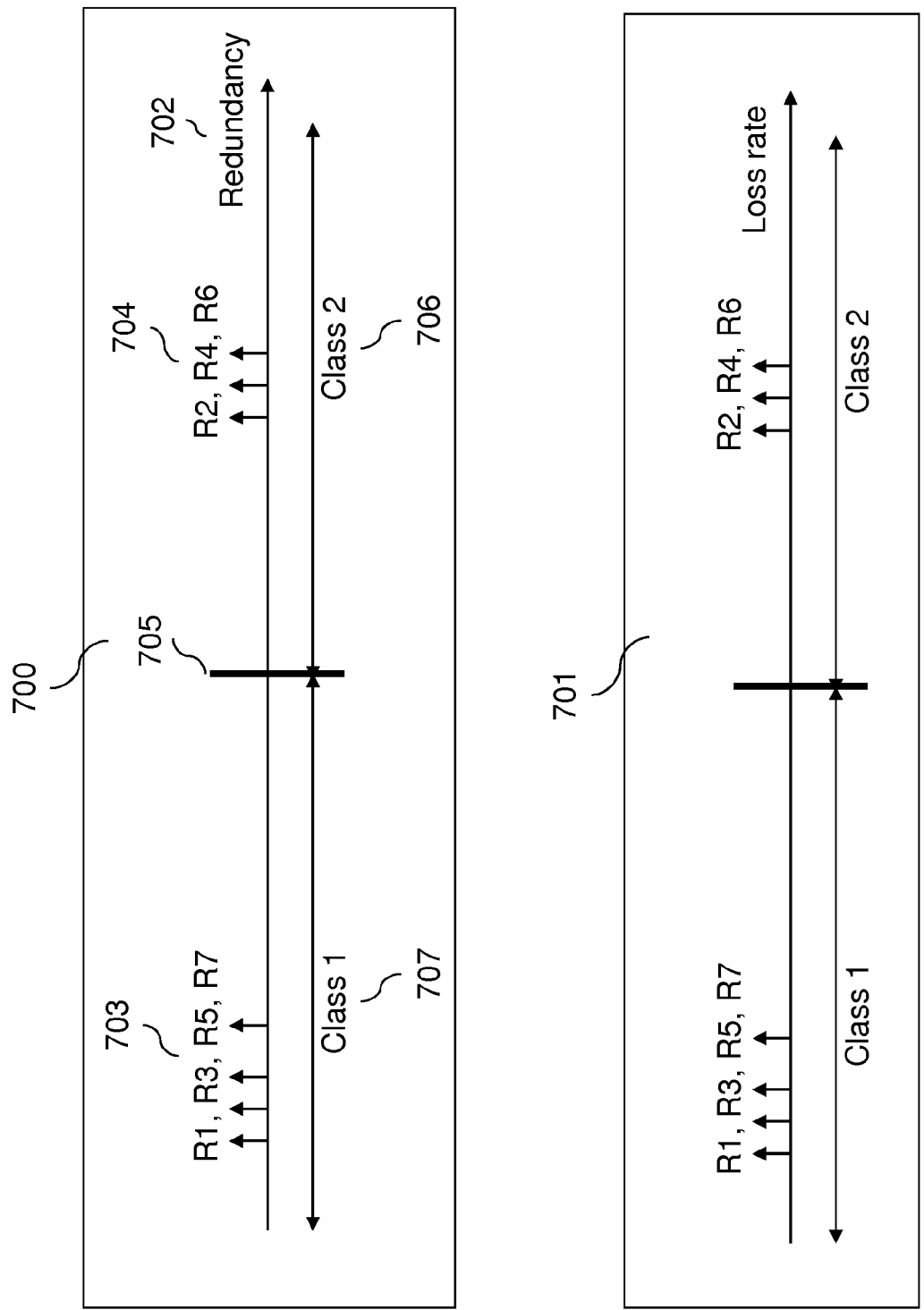
FIG. 7 is a diagrammatic representation of two packet classifications which may be implemented in a particular embodiment of the method of the present invention.

FIG. 7 illustrates a diagrammatic explanation of the manner in which the two classes are used. In the classification 700, the FEC redundancy level is taken into account. In the classification 701, the average loss rate is taken into account. In FIG. 7, the periods of time R1 to R7 are represented. A horizontal line 702 indicates the FEC redundancy level. By way of example, if an FEC redundancy packet is generated for n packets of payload data, the level of redundancy is 1/n. Consequently, the lower the value of n, the higher the redundancy level, and the higher the protection. The different periods of time are represented according to their level of redundancy. For example, at 703, four periods of time are represented and at 704, three other periods are represented. It is sought to determine a limit value which enables the periods to be classified into two classes 706 and 707. The limit value 705 initially has the average value for all the periods of time. Next, an algorithm known by the name "Lyod-max" (see paper by S. P. Lloyd, "Least squares quantization in PCM", IEEE Trans. Inform. Theory, volume IT-28, pages 129-137, March 1982) may be used to optimize the limit value 705. The same classification may be obtained on the basis of the loss rates, as illustrated at 701.

Transitions are detected on the basis of the lost packets. The lost packets constitute a learning base. Transitions are thus defined on the basis of this learning base. The learning base is segmented into homogeneous periods, and it is desired to define the class of each homogenous period. Either the redundancy rate is used, or the average loss rate is used. However, the redundancy rate is correlated with the loss rate. Thus, it is probable that the classification with the loss rate gives a classification close to that obtained with the redundancy rate.

FIG. 8 sets out the two possible strategies in this embodiment.

The second strategy is represented at 608.

This strategy consists of regularly adapting the FEC redundancy level if a congestion period is considered to be in course. When the congestion period is finished, the default value of the FEC parameters is used.

During step 802, if a new transition signal is received (see module 248 in FIG. 3), the last period of time of the database of periods of time is selected during a step 803. This period is the period which finishes with the new transition signal and begins with the preceding transition. During a step 805, a test is carried out to determine whether or not this period of time is of the second class (for example during a period of congestion), that is to say a high level of protection (high FEC redundancy rate). If the selected period is of the second class, during a step 807, the default value of the FEC parameter is selected as the current value of the FEC parameter. More particularly, during step 607, the probability of alternation was determined as high. This means that the probability that the current period of time does not correspond to a congestion is high. Consequently, to anticipate the occurrence of the next congestion, the FEC parameter takes a high value.

If the last period of time is not of the second class, the value of the FEC parameter is computed during a step 806, taking into account the lost packets obtained after the last transition signal 802. In this way, the FEC level is adjusted to the conditions of the current congestion period. To be precise, only the losses detected as from the last transition are taken into account in the computation of the value of the FEC parameter. This makes it possible to minimize the FEC proportion while ensuring a good correction capability.

The FEC adjustment algorithm is implemented at regular intervals of time, on the basis of a time out 809. For example, a new FEC parameter value computation may be carried out as soon as ten new lost packets have been detected or every 200 ms.

The first strategy is represented at 609. This strategy is adopted if the probability of alternation is low. In this case, the FEC parameter value by default is read during a step 811 and the FEC protection level takes this value during a step 812.

Figure 9:
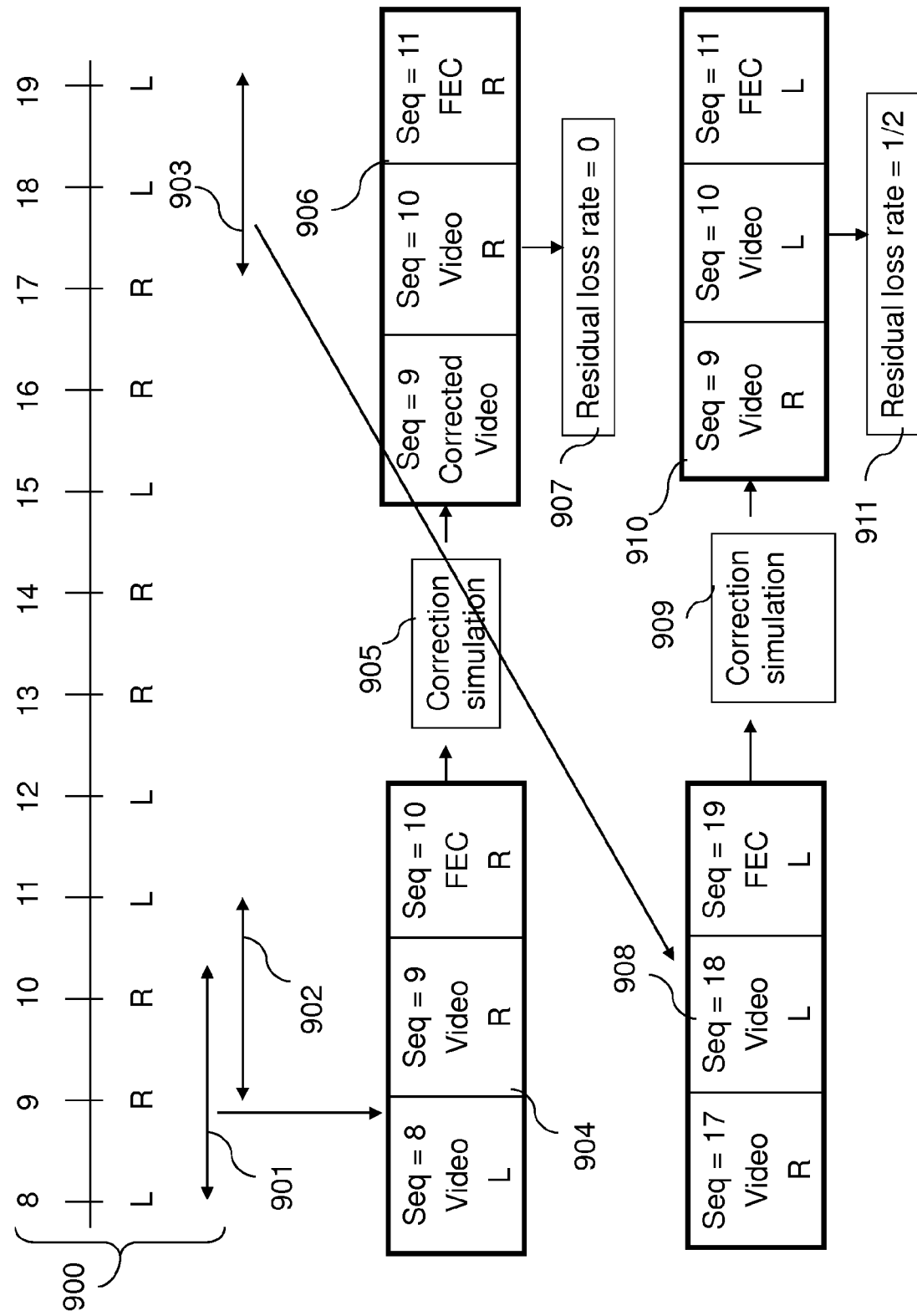
FIG. 9 represents elements implemented for the determination of a residual loss rate after error correction.

FIG. 9 represents an example of computation of the FEC parameter value. These parameters determine the redundancy level which enables the data packets to be protected. In this example, it is assumed that the protection of the data packets is carried out by an XOR FEC of parameter (1, n). These values mean that n data packets are used to generate an FEC packet. If one of those data packets is lost over the network, it may be restored on the basis of the other data packets and of the FEC redundancy packet.

Such an FEC format is well known and is used to protect RTP packets as described in the document RFC-5109. Other FEC may be used, such as Reed-Solomon codes. The Reed-Solomon FEC parameters differ from the example given above. However, the person skilled in the art knows how to adapt the description to other types of FEC.

The redundancy level depends on the value of the parameter n. If n is low (for example 3), the correction capability will be greater than that linked to a higher value. It is sought to compute the optimal value for n. For example, if the target loss rate after protection by FEC is LR=0.00001, the value of n must be determined to reach that loss rate after protection by FEC.

The sequential numbers of the packets lost during the last temporal period are selected. It is assumed that the sequential numbers are those illustrated at 900.

In this example, the sequential numbers of the lost packets are 8, 11, 12, 15, 18 and 19. The sequential numbers of the received packets may be deduced from those of the lost packets. On the basis of these two sets of numbers, it is attempted to determine the best value for the parameter n To compute it, different candidate values are tested. For each candidate value, and on the basis of the two sets of sequential numbers, a loss rate LR is computed. The value of the parameter n which gives the closest value to the target loss rate is chosen as the value to use.

For example, when the candidate value is tested n=2. Different simulations made with the sets of numbers of packets lost and received are conducted to determine the corresponding loss rate. Such a simulation is described with reference to FIG. 9.

In the first of these simulations, during a step 901, three consecutive sequential numbers are selected and placed in a table 904. These are the sequential numbers 8, 9 and 10, in FIG. 10. The numbers 9 and 10 correspond to packets transmitted and the number 8 to a lost packet. Since the candidate value is equal to 2, the packets of sequential numbers 8 and 9 are assumed to be data packets and the packet of sequential number 10 is assumed to be an FEC redundancy packet.

Based on these three packets, a correction is simulated during a step 905. The result of this simulation is illustrated at 906. The lost data packet, of sequential number 8, is corrected. Consequently, the residual loss rate for the two data packets of sequential numbers 8 and 9 is 0.

The same simulation is carried out by progressively shifting the triplet of sequential numbers, as illustrated at 902 and, after nine shifts, at 903. In this last case, the packets of sequential numbers 18 and 19 are lost. These values are inserted into the table 908 and the error correction is simulated. Due to the proportion of lost packets, which is two thirds, their correction is not possible with a single FEC redundancy packet. The residual error rate is ½.

Thus, for each shift, it is possible to compute the number of residual lost packets after correction, from among the two data packets. This number is called L(i,n). For each shift the number of initial losses is denoted: B(i,n). The FEC correction rate with the parameter 'n' is thus:

$$\tau(n) = \sum_{i=1}^{T(n)} L(i, n) \Big/ \sum_{i=1}^{T(n)} B(i, n)$$

with the total number of shifts for a given value of n being T(n). The simulated final loss rate is $$LR(n) = \tau(n) \cdot \frac{A}{B}$$

with 'A' being the number of losses in the sample 900 and 'B' being the total number of sequence numbers in the sample 900. Here, we have A=6 and B=12. Several candidate values of n are tested. The value which gives the loss rate aimed for is chosen as FEC parameter value. It is used during the period of time characterizing step 504.

The same algorithm is implemented by module 806 illustrated in FIG. 8. However, in this case, a whole period of time is not processed. Only the sequential numbers of the packets lost since the last detected transition are used. As a matter of fact, the algorithm for computing the FEC parameter is implemented despite the current congestion period not being finished.

Figure 10:
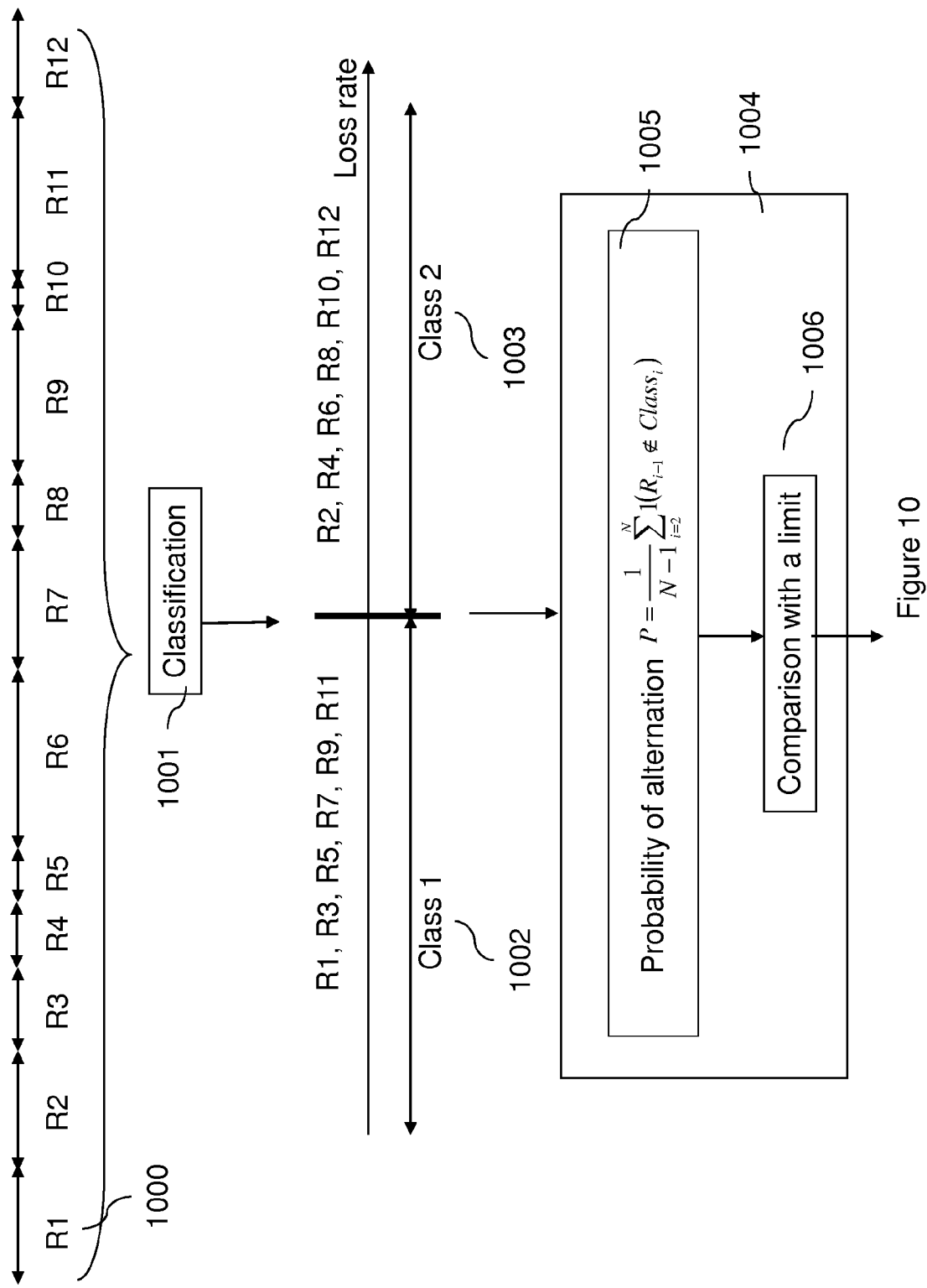
FIG. 10 is a flow diagram representation of steps of probability determination implemented in one of the steps illustrated in FIG. 6.

FIG. 10 illustrates how, during step 607, the probability of alternation is computed. In particular, frame 1004 corresponds to the processing carried out during step 607.

Reference 1000 represents a set of periods of time from the database 402 of periods of time. Here, twelve periods R1 to R12 are illustrated. References 1002 and 1003 represent these periods of time classified as set out with reference to FIG. 7. Here, the periods of the first class are the periods R1, R3, R5, R7, R9 and R11.

During step 607, the probability of alternation is computed according to the following equation:

$$P = \frac{1}{N-1} \sum_{i=2}^{N} 1(R_{i-1} \notin \text{Class}_i)$$

$\text{Class}_i$ is the class of the period of time $R_i$ and N is the number of periods of time considered. In other words, P is the number of alternations between the two classes during passage through the successive periods of time, divided by N−1. If the probability P is greater than a given limit value, the probability of alternation is considered to be high. For example, the limit value is 0.95.

Figure 11:
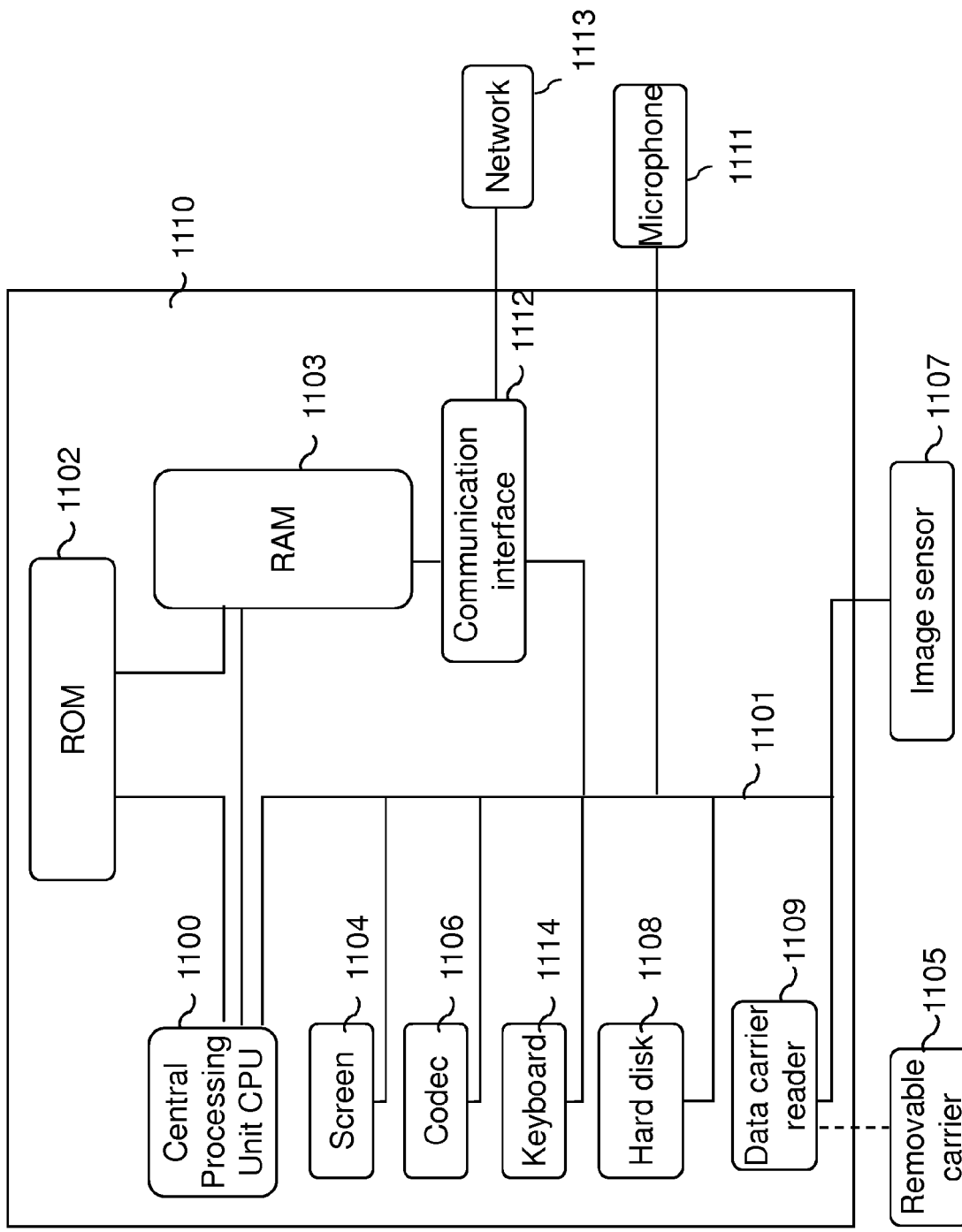
FIG. 11 is a diagrammatic representation of a particular embodiment of a device of the present invention.

FIG. 11 represents a particular embodiment of a code-stream processing device of the present invention. In this embodiment, the device is a media server or a media client 1110. The device 1110 comprises a communication interface 1112 connected to a network 1113 adapted to receive digital data to process. The device 1110 also comprises storage means 1108, such as a hard disk, and a drive 1109 for a disk 1105. The disk 1105 may be a diskette, a compact disc (CD-ROM), a digital video disc (DVD), a memory card or a USB peripheral, for example. The disk 1105 and the storage means 1108 may store processed data as well as at least one program implementing the method of the present invention, once read by the device 1110. As a variant, each program enabling the device 1110 to implement the method of the present invention may be stored and read in a read only memory 1102 (called ROM, for Read Only Memory). As a variant, each program may be received from the communication network 1113, to be stored as disclosed above.

The device 1110 has a display screen 1104 to display the processed data and to serve as interface with the user, for example in order for the latter to select data to process, with a keyboard 1114 or any other means, in particular a pointing means.

The central processing unit 1100 (termed CPU in FIG. 11), executes the instructions of each program implementing the method of the present invention. For example, the central processing unit 1100 carries out the steps illustrated in FIG. 4 and/or FIG. 16. On powering up, each said program is transferred from a non-volatile memory, for example the memory 1102, into a random access memory (RAM) 1103, which then comprises the executable code as well as the registers for storing the variables necessary to implement the present invention.

Generally, an information carrier, such as a computer-readable storage medium, which may be read by a computer or a microprocessor, integrated into the device or not, and which may be partially or totally removable, stores a program implementing the method of the present invention.

The communication bus 1101 enables the communication between the various elements of the device 1110 which are connected to it. The representation of this bus 1101 is non-limiting and, in particular, the central processing unit 1100 unit may communicate instructions to any element of the device 1110, directly or by means of other elements of the device 1110.

The device 1110 further comprises a codec (or coder-decoder) 1106, for example in the form of a standard chip, used in conventional manner by the central processing unit 1100 via the bus 1101, to encode or decode the data received from the network 313 or from an electronic image sensor 1107, for example a digital camera.

Figure 15:
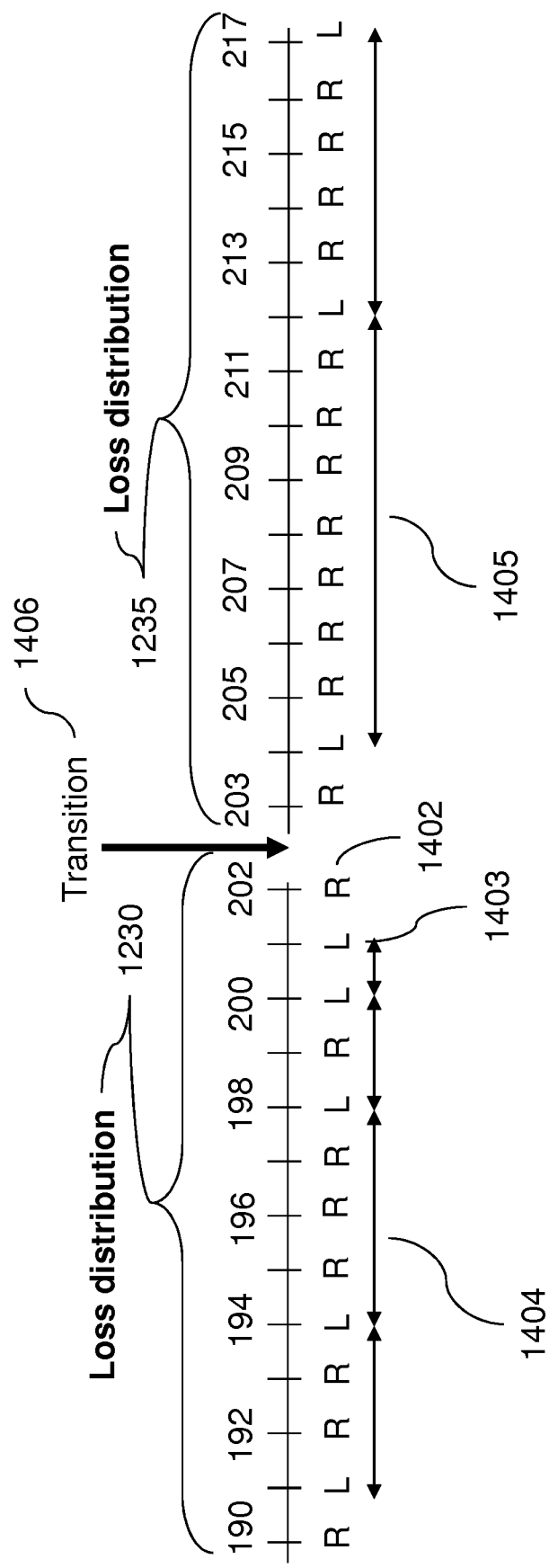
FIG. 15 is a diagrammatic representation of a succession of packets sent by a server according to a particular embodiment of the invention.

FIG. 15 illustrates the operation of the module 148 in a further embodiment of the invention. In FIG. 15, a list of sequence numbers corresponding to the packets sent is represented. This list commences with a sequence number 190 and ends with a sequence number 217. These sequence numbers correspond either to packets 1402 received by the client, referenced by an "R", for example the number 202, or to packets 1403 lost over the network, referenced by an "L", for example the number 201.

The module 148 only stores in memory the sequence numbers relative to packet losses. However, in the interest of explanation, the sequence numbers of both received packets and of lost packets are represented in FIG. 15. In FIG. 15, it has been considered that the losses arise from two loss distributions. The first loss distribution 1230 corresponds to the packets the numbers of which go from 190 to 202. The second loss distribution 1235 corresponds to the packets the numbers of which go from 203 to 217.

For the first loss distribution 1230, the loss rate is higher than for the second loss distribution 1235. The difference between sequence numbers of successive lost packets, illustrated by the arrows 1404 and 1405 is, consequently, smaller for the first distribution law 1230 than for the second distribution law 1235. There is thus a transition 1406 between two loss distribution laws. The function of the module 148 is to detect this transition 1406 as quickly as possible. This makes it possible to transmit to the module 149 only the numbers for packets lost between 203 and 218. The accuracy of the FEC redundancy level calculated by the module 149 is then better because only the losses corresponding to the last loss distribution law 1235 are used.

Figure 16:
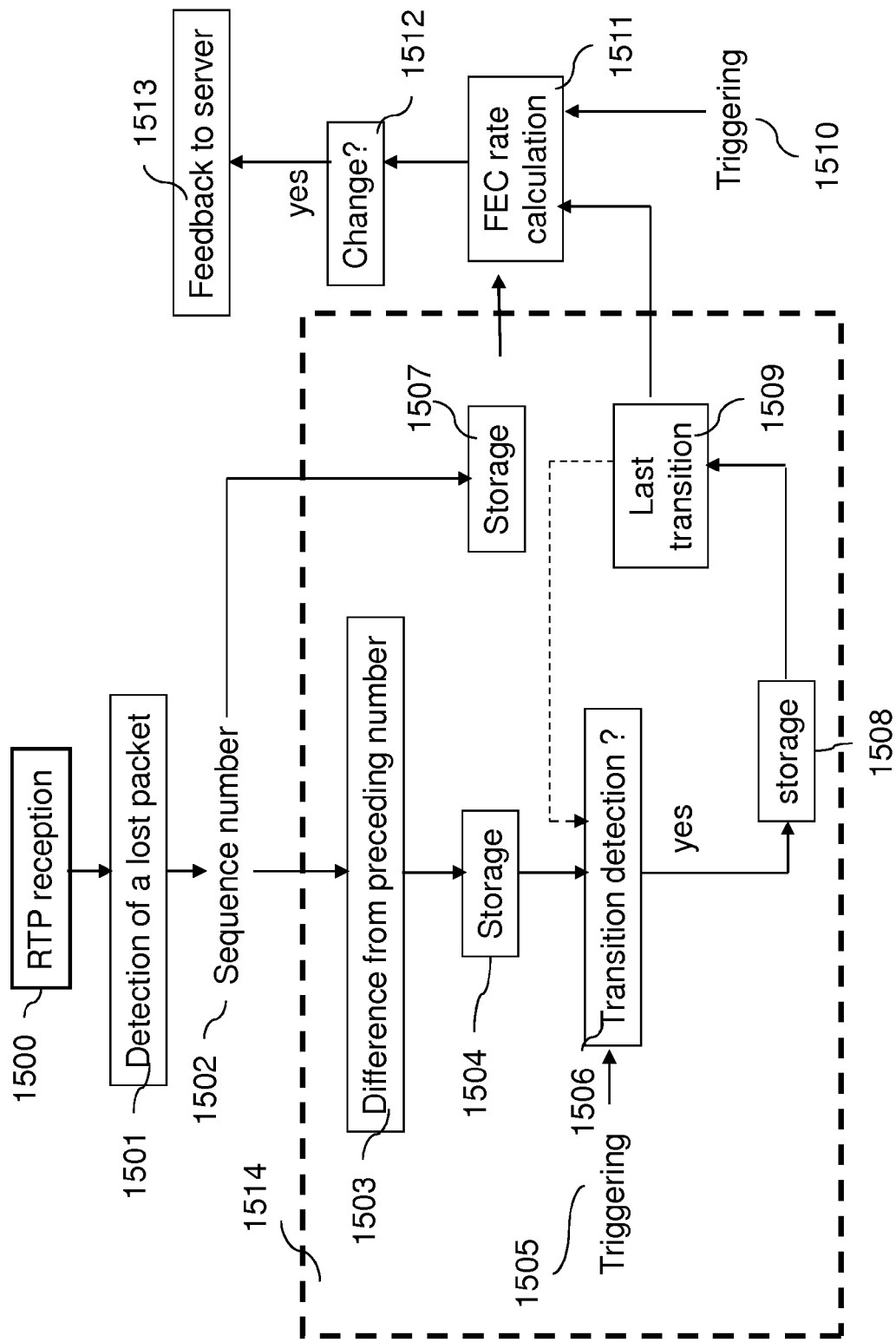
FIG. 16 represents, in flow-diagram form, steps implemented in a particular embodiment of the method of the present invention.

FIG. 16 represents, in flow-diagram form, implementation steps for the data illustrated in FIG. 15. FIGS. 16 and 12 detail, in particular, the way in which the FEC redundancy level is calculated at the module 149 of the client 101. FIGS. 16 and 12 show how the transitions are detected to select the set of lost packets used to calculate the FEC redundancies.

During a step 1500, an RTP packet is received by the client 101. On reception of that packet, any packet lost since the previous reception of a packet is detected. For example, if the packets having the sequence numbers 10000 and 10002 are received, it is deduced thereby, during a step 1501, that the packet having sequence number 10001 has been lost. During a step 1502, the sequence number of each lost packet is extracted. As soon as a lost packet number is supplied, it is stored in buffer memory during a step 1507.

In parallel, during a step 1503, determination is made of the difference in sequence number between each lost packet and the lost packet preceding it. This difference is placed in buffer memory during a step 1504. During a triggering step 1505, it is determined when a transition detection algorithm must be launched. This triggering may be based either on a clock (for example, the transition detection algorithm is launched every ten milliseconds), or be based on an external event (for example a new lost packet sequence number has been placed in buffer memory). When the triggering is carried out, during a step 506, detection of a transition on the packet loss distribution law is attempted on the basis of the differences in sequence number between successive lost packets.

The detection of a transition is preferably made solely on the basis of difference between sequence numbers subsequent to the last transition detection. FIG. 12 illustrates this manner of operation. The buffer memory 1225 stores the sequence numbers of lost packets. The buffer memory 1224 stores the differences in sequence numbers between lost packets.

Let it be assumed that the last transition 1220 detected between distribution laws corresponds to the lost packet 1222 and to the difference 521 in sequence numbers. The set of differences in sequence numbers used during step 1506, to determine a possible new transition, corresponds to the differences subsequent to the difference 1221. In other words, only the differences 1223 are used to detect a possible new transition.

If a new transition is detected during step 1506, the sequence number corresponding to that new transition is stored in memory during a step 1508. Next, the last transition is updated, during a step 1509, in order for the step 1506 to aim to detect a new transition, subsequent to the updated transition, on the basis of the differences in sequence numbers subsequent to that transition.

During a step 1510, a second triggering is used to trigger an algorithm which calculates the FEC redundancy level, during a step 1511. This triggering is carried out each time a loss distribution law transition is detected during a step 1506 and at regular intervals of time if no transition is detected. During step 1511, all the sequence numbers greater than that corresponding to the last transition that was updated during step 1509 are read from the buffer memory used during step 1507 to store the sequence numbers of the lost packets. On the basis of this set of sequence numbers, a new FEC redundancy parameter value, or redundancy level, is calculated.

During a step 1512, it is determined whether that new value differs from the previous one. If so, a feedback message is sent to the server 100 to notify it of the level of protection to use. One possible way to calculate the level of protection by FEC redundancy is described with reference to FIG. 17.

It is to be noted that the detection of a transition in the loss distribution law may arise with a certain latency (delay in detection), during step 1506. The effect of this latency is however limited as shown by the study of the two possible cases:

- in case of increase in the frequency of the losses (the level of protection previously being low), the FEC redundancy level will be updated quite quickly since the number of losses is high and since the detection will therefore be fast since it depends on the number of losses and
- in case of reduction in the frequency of the losses, the FEC redundancy level will be greater than that which is necessary and the consequences of the delay will therefore be limited.

FIG. 13 describes the detail of step 1506, that is to say how the transitions are detected. As disclosed above, a set of differences is used therein of sequence numbers that are stored in the buffer memory 1504 or, preferentially, the subset of the differences in sequence numbers stored in the buffer memory 1504 which are subsequent to the last transition detected. This input of numbers takes the form of a table 1300. The object of step 1506 is to detect whether a transition has taken place and, if yes, what sequence number it corresponds to. The result of the transition detection is represented in FIG. 14 as described above.

Figure 17:
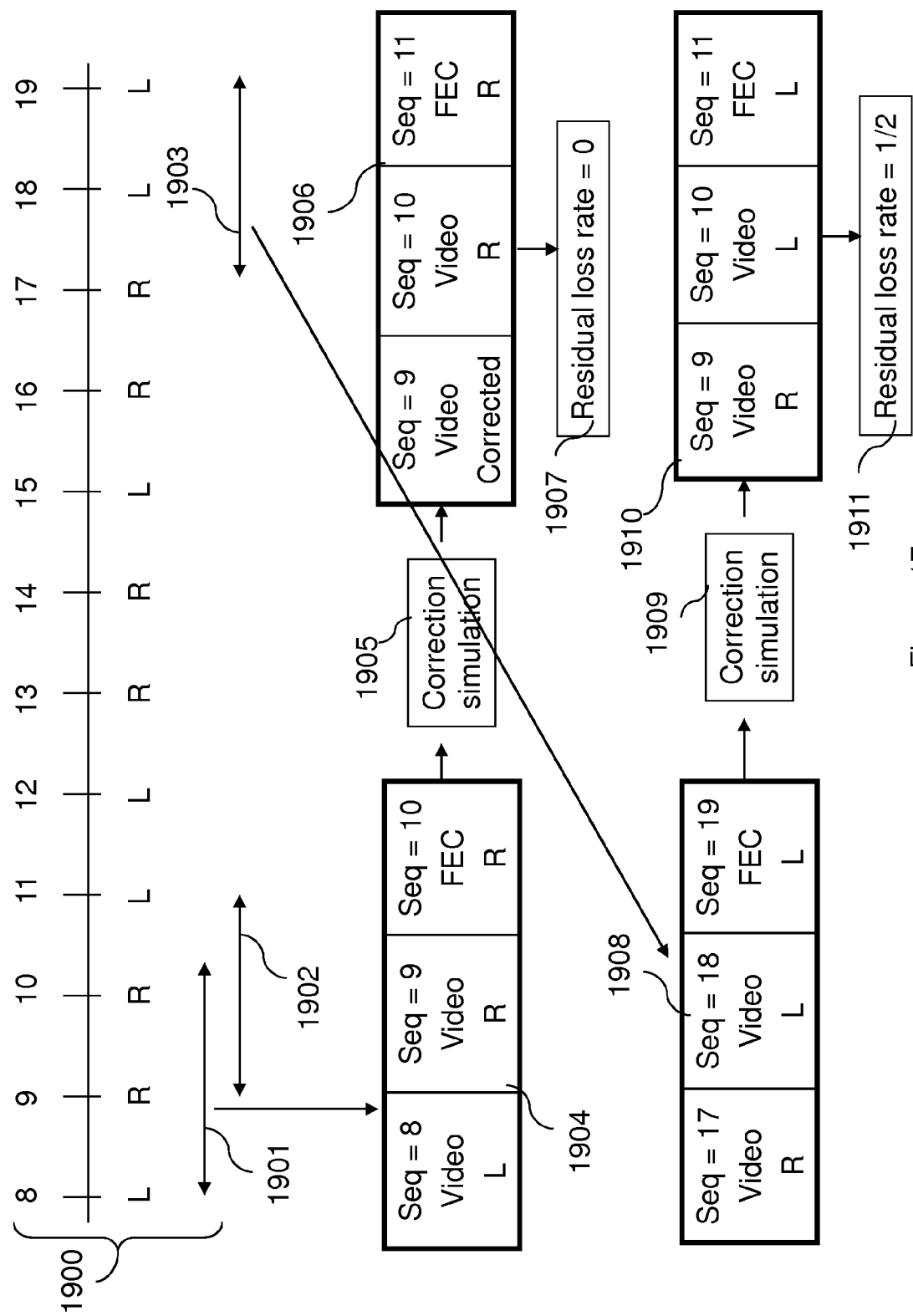
FIG. 17 represents elements implemented for the determination of a residual loss rate after error correction according to a particular embodiment of the present invention.

FIG. 17 gives an example of step 1511 for calculating the value of the FEC redundancy parameters. These parameter values determine the redundancy level which enables the data packets to be protected. In this example, it is assumed that the protection of the data packets is an XOR FEC function of parameter (1, n). This means that n data packets are used to generate an FEC redundancy packet. If one of those n data packets is lost over the network, it may be restored on the basis of the n–1 other data packets and of the FEC redundancy packet. Such a format is well known for protecting the RTP packets as detailed in the document RFC-5109. It is noted that other types of FEC error correcting codes may be used, such as Reed-Solomon codes. The parameters for Reed-Solomon codes differ from the example given. However, the adaptation of the following description to another type of FEC is easily within the capability of the person skilled in the art.

As concerns the parameter n, the lower its value, the higher the correction capability. It is sought to optimize the value of n so as, at the same time, to have a sufficient correction capability and for that purpose, not to use too high a proportion of the available throughput.

Let it be supposed that step 1511 is triggered by the trigger 1510. The sequence numbers of the packets lost since the last transition are selected. For example, these numbers are those illustrated at 900, FIG. 17. In this example, the sequence numbers of the lost packets are 8, 11, 12, 15, 18 and 19. The sequence numbers of the received packets are thus 9, 10, 13, 14, 16 and 17. To calculate the value of the parameter n, different candidate values are tested. For each candidate value, a loss rate is calculated. The candidate value which gives a loss rate which is the closest to the target rate calculated on the basis of the sequence numbers of the lost packets is selected as the value for n.

Let the candidate value for n be equal to 2. Several simulations made on the real sequence are carried out to determine the loss rate if that candidate value were to be selected. In the first simulation, a triplet 901 of three consecutive sequence numbers are selected and placed in a table 904. These are the sequence numbers "8", "9" and "10", in FIG. 17. The numbers 9 and 10 correspond to received packets. Since the candidate value is equal to 2, the packets of sequence numbers 8 and 9 are assumed to be data packets and the packet of sequence number 10 is assumed to be an FEC redundancy packet.

Based on these three packets, a correction is simulated during a step 905. The result of this simulation is illustrated at 906. The lost data packet, of sequence number 8, is restored. Consequently, the residual loss rate for the two data packets of sequence numbers 8 and 9 is 0.

The same simulation is carried out by progressively shifting the triplet of sequence numbers, as illustrated at 902 and, after nine shifts, at 903. In this last case, the packets of sequence numbers 18 and 19 are lost. These values are inserted into the table 908 and the error correction is simulated. Due to the proportion of lost packets, which is two thirds, their correction is not possible with a single FEC redundancy packet. The residual error rate is ½.

Thus, for each shift, it is possible to calculate the number of residual packets that are lost, after correction, from among the two data packets.

This number is called L(i, n).

For each shift the number of initial losses is denoted: B(i, n). The FEC correction rate with the parameter 'n' is thus:

$$\tau(n) = \sum_{i=1}^{T(n)} L(i, n) \Big/ \sum_{i=1}^{T(n)} B(i, n)$$

with the total number of shifts for a given value of n being T(n) The simulated final loss rate is $$LR(n) = \tau(n) \cdot \frac{A}{B}$$

with 'A' being the number of losses in the sample 900 and 'B' being the total number of sequence numbers in the sample 900. Here, we have A=6 and B=12. Several candidate values of n are tested. The value which gives the loss rate aimed for is chosen as FEC parameter value. It is either sent directly to the server during step 1513 or its redundancy level (1/n) is transmitted.

The invention claimed is:

1. A method for adapting error protection in a communication network, the method comprising:
    a step of determining periods of time that are homogeneous as regards the distribution law of losses over the network;
    a step of classifying the homogeneous periods of time into at least two classes, on the basis of information representing losses over the network and/or representing a corresponding level of protection against errors, during these periods of time;
    a step of selecting a protection strategy on the basis of said classes; and
    a step of determining a probability of alternation between two of said classes, wherein the protection strategy is selected on the basis of said probability of alternation.

2. A method according to claim 1, wherein, during the step of selecting a protection strategy, a first strategy that may be selected comprises implementing a fixed level of protection for the future homogeneous periods of time for each class, and a second strategy that may be selected comprises implementing a fixed level of protection for the future homogeneous periods of time for one of the classes and a variable level of protection for the future homogeneous periods of time for another class.

3. A method according to claim 2, wherein, in the case of the second strategy:

the class of homogeneous periods of time for which a fixed level of protection has been implemented corresponds to the periods of time that have suffered the least losses, and the other class of homogeneous periods of time for which a variable level of protection has been implemented corresponds to the periods of time that have suffered the most losses.

4. A method according to claim 2, wherein the first strategy is selected when the probability of alternation is less than a predetermined value and the second strategy is selected when the probability of alternation is greater than a predetermined value.

5. A method according to claim 2, wherein, during the strategy selecting step, in the first or the second strategy, the fixed level of protection corresponds to the protection necessary for the period of time suffering the highest rate of loss.

6. A method according to claim 1, wherein, during the classifying step, a first class corresponds to the periods of time with a low level of FEC protection and/or a low loss rate and a second class corresponds to the periods of time with a high level of protection by FEC and/or a high loss rate.

7. A method according to claim 1, wherein, during the classifying step, a "Lloyd-max" algorithm is implemented.

8. A method according to claim 1, wherein, during the step of determining a probability of alternation, this probability is equal to the number of alternations between the two classes on passing through the successive periods of time, divided by the number of periods considered less one.

9. A removable or non-removable storage medium for computer or microprocessor readable information, storing instructions of a computer program, characterized in that it makes it possible to implement the method according to claim 1.

10. A device for adapting error protection in a communication network, comprising:

means for determining periods of time that are homogeneous as regards the distribution law of losses over the network, means for classifying the homogeneous periods of time into at least two classes, on the basis of information representing losses over the network and/or representing a corresponding level of protection, during these periods of time, means for selecting a protection strategy on the basis of said classes; and means for determining a probability of alternation between two of said classes, and wherein the means for selecting is operable to select the protection strategy on the basis of said probability of alternation.

11. A method of detecting transition between two states of a communication network corresponding to different loss rates of sent data, the method comprising:

a step of determining a probability of transition; and a step of determining the existence of a transition on the basis of said probability, wherein, the communication network conveys data packets and the step of determining a probability of transition comprises:

a step of detecting lost packets from among the data packets sent;

a step of determining distances representing separations between the sequence numbers of said lost packets, and a step of calculating probability of transition between a first set of distances and a second set of distances chosen from among the determined distances.

12. A method of detecting transition according to claim 11, wherein during the step of determining a probability, the probability of transition is determined on the basis of the data losses occurring after the last detected transition.

13. A method according to claim 11, wherein, the communication network conveying data packets, during the step of determining a transition probability, determination is made, for a plurality of candidate packets sent since the last detected transition, a probability of a transition taking place at the time of the transmission of one of those candidate packets.

14. A method according to claim 13, wherein to determine the transition probability, a candidate packet is selected for which the probability constitutes an extremum of the probabilities corresponding to the various candidate packets and the probability corresponding to the selected candidate packet is compared to a predetermined limit value.

15. A method according to claim 14, wherein during the step of determining a transition probability, determination is made of a probability that two different loss distribution laws exist on respective opposite sides of the candidate packet, said extremum being a maximum.

16. A method according to claim 15, wherein during the step of determining a transition probability, determination is made of a probability that the same loss distribution laws exists on respective opposite sides of the candidate packet, said extremum being a minimum.

17. A method according to claim 11, wherein during the step of determining a probability, a Wilcoxon test is carried out.

18. A method of protecting data against losses at the time of their transmission over a communication network, comprising:

a step of detecting a transition in the packet loss rate according to claim 11, a step of determining error protection parameters based solely on the period of time elapsed since the last transition, and a step of operating error protection parameters determined during the determining step.

19. A method according to claim 18 wherein the step of determining error protection parameters comprises determining a redundancy level based solely on the period of time elapsed since the last transition, and the step of operating error protection parameters comprises generating redundant data the level of which depends on the level of redundancy determined during the determining step.

20. A method according to claim 19, wherein during the step of determining the redundancy level, said redundancy level is determined by a client and transmitted to a data server.

21. A method according to claim 19 wherein during the step of determining the redundancy level, the level of redundancy is determined on the basis of the maximum loss rate determined for a period of time separating two detected transitions.

22. A method according to claim 21 wherein during the step of determining the redundancy level, for each of a plurality of redundancy level candidate values, determination is made of a residual loss rate after restoration of the data truly lost by simulating the implementation of the candidate redundancy level value and that residual loss rate is compared to a target value.

23. A removable or non-removable storage medium for computer or microprocessor readable information, storing instructions of a computer program, characterized in that it makes it possible to implement the method according to claim 11.

24. A device for detecting transition between two states of a communication network corresponding to different loss rates of sent data, comprising:
   a means for determining a probability of transition; and
   a means for determining the existence of a transition on the basis of said probability,
   wherein, the communication network conveys data packets and the means for determining a probability of transition is operable to determine the probability by:
      detecting lost packets from among the data packets sent;
      determining distances representing separations between the sequence numbers of said lost packets, and
      calculating probability of transition between a first set of distances and a second set of distances chosen from among the determined distances.

25. A device for protecting data against losses at the time of their transmission over a communication network, comprising:
   a device for detecting a transition between packet loss rates according to claim 24,
   a means for determining a redundancy level based solely on the period of time elapsed since the last transition, and
   a means for generating redundant data the level of which depends on the level of redundancy determined during the determining step.

* * * * *